United States Patent
Li et al.

(10) Patent No.: US 12,501,597 B2
(45) Date of Patent: Dec. 16, 2025

(54) METHOD FOR PERFORMING ONLINE PICK-AND-PLACE PATH OPTIMIZATION SIMULTANEOUSLY DURING THE PRODUCTION OF A SURFACE MOUNT MACHINE

(71) Applicant: Ningbo Yik-Tong Intelligent Technology Co., LTD, Zhejiang (CN)

(72) Inventors: Zhengkai Li, Zhejiang (CN); Xinghu Yu, Zhejiang (CN); Hao Sun, Zhejiang (CN); Huijun Gao, Zhejiang (CN)

(73) Assignee: Ningbo Yik-Tong Intelligent Technology Co., LTD, Ningbo (CN)

( * ) Notice: Subject to any disclaimer, the term of this patent is extended or adjusted under 35 U.S.C. 154(b) by 193 days.

(21) Appl. No.: 18/491,403

(22) Filed: Oct. 20, 2023

(65) Prior Publication Data
US 2024/0244814 A1    Jul. 18, 2024

(30) Foreign Application Priority Data

Jan. 16, 2023 (CN) .......................... 202310110779.1

(51) Int. Cl.
*H05K 3/30*   (2006.01)
*H05K 13/04*  (2006.01)

(52) U.S. Cl.
CPC ....... *H05K 13/046* (2013.01); *H05K 13/0452* (2013.01)

(58) Field of Classification Search
CPC ............. H05K 13/0452; H05K 13/046; H05K 13/0853
See application file for complete search history.

(56) References Cited

U.S. PATENT DOCUMENTS

| | | | |
|---|---|---|---|
| 6,729,018 B1 * | 5/2004 | Takano | H05K 13/0813 29/832 |
| 7,664,554 B2 * | 2/2010 | Maenishi | G05B 19/41805 700/9 |
| 2020/0030834 A1 | 1/2020 | Gao et al. | |
| 2024/0242092 A1 * | 7/2024 | Gao | G06N 3/126 |

FOREIGN PATENT DOCUMENTS

| | | |
|---|---|---|
| CN | 111586992 A | 8/2020 |
| CN | 111615324 A | 9/2020 |

* cited by examiner

*Primary Examiner* — Paul D Kim

(57) ABSTRACT

There is provided a method of performing online optimization on a pick-mount path during production of a surface mount machine and a pick-mount path optimization method of a surface mount machine is provided. In order to address the problem of too long pick-mount path resulting from poor optimal solution search capability when the existing surface mount machine performs optimization based on heuristic algorithm by calling software, the method includes: based on a mount optimization solver of the surface mount machine, obtaining an initial mount process optimization result, and transmitting the result into an industrial control computer of the surface mount machine to start surface mount production; based on the tabu search, performing comparison on the pick-mount path optimization results to select an optimal one and transmitting the newly-obtained optimal result into the industrial control computer of the surface mount machine, and then by starting from a next circuit board.

9 Claims, 7 Drawing Sheets

METHOD FOR PERFORMING ONLINE PICK-AND-PLACE PATH OPTIMIZATION SIMULTANEOUSLY DURING THE PRODUCTION OF A SURFACE MOUNT MACHINE

CROSS-REFERENCE TO RELATED APPLICATION

This application claims priority from the Chinese patent application 2023101107791 filed Jan. 16, 2023, the content of which is incorporated herein in the entirety by reference.

TECHNICAL FIELD

The present disclosure relates to the field of electric appliance technologies and electrical engineering, and in particular to a pick-and-place path optimization method of a surfaced mount machine.

BACKGROUND

In modern production and lives, people cannot live without various electronic products. A key stage in an assembling process of an electronic product is the assembling of a circuit board, which requires the use of surface mount technology. The core equipment of the surface mount technology is a surface mount machine. The surface mount machine can quickly pick an electronic component, an electronic device, and a chip and mount them to the corresponding placement point on the surface of the circuit board accurately and quickly. For ease of description, the "electronic component, electronic device, and chip" are collectively referred to as "component", and the "pick and place" are referred to as "PAP".

In the current market, the surface mount machines are all constructed on a gantry-type three-dimensional movement platform shown in FIG. 1: a plurality of sucking rods capable of sucking and blowing air are mounted equidistantly inside a surface mount carrier; each suck rod is driven to move up and down along a Z direction by a motor inside the surface mount carrier; and the surface mount carrier is driven by a horizontal movement guide rail and a fixed guide rail to move along X and Y directions in a horizontal plane. With the above movement mechanism, picking, movement, and mounting for the components can be completed. Before the pick-mount process is started, when the circuit board is conveyed to a stop pin by a circuit board conveying belt, the circuit board is pressed and fixed. During the pick-mount process, a component feeder fixedly mounted on a base of the component feeder will automatically replenish the components, and the components supplied to be in the proper position will appear at a pick point at the front of the material feed and wait for being picked.

The pick-mount process of the surface mount machine is shown in FIG. 2. Since the number of the sucking rods is limited to be much less than the number of the placement points, the surface mount carrier needs to complete the mounting of one complete circuit board through several pick and place periods (PAP cycles). One pick-mount process in one PAP cycle can be summarized as follows: the surface mount carrier firstly moves to the base of the component feeder; the sucking rods of the surface mount carrier move to the corresponding pick point to pick up an component respectively; when all sucking rods pick their respective components, the surface mount carrier moves to the circuit board; each sucking rod on the surface mount carrier moves to the corresponding placement point for mounting of the corresponding component. After all sucking rods complete the mounting of the components, the pick-mount process of the next PAP cycle is started.

The pick-mount process of the surface mount machine is optimized to greatly shorten the surface mount time. The optimization problem includes three sub-problems, that is, "component distribution problem", "position distribution problem of component feeder" and "optimization problem of the pick-and-place path". "Component distribution" is to determine a type of an component mounted by each sucking rod in each PAP cycle; "position distribution of component feeder" is to determine a mount position of each component feeder on the base of the component feeder. "The optimization of the pick-and-place path" is completed in two steps: firstly, under the constraint of satisfying the component distribution, performing "placement point" distribution to determine the placement points to be mounted by the sucking rods in each PAP cycle; subsequently, optimizing a "placement sequence", that is, determining a sequence in which the sucking rods perform mounting in each PAP cycle.

An important target for optimization of the pick-mount process is minimizing the length of the pick-and-place path. In a pick-mount process, a movement path of the surface mount carrier is referred to as a pick-and-place path of the surface mount machine. Based on the type of start point and end point of each section of path, the pick-and-place path of any one PAP cycle can be divided into four classes: 1) a pick path in which the sucking rods complete the picking of the components sequentially in the current period, where its start point and end point both are pick points; 2) a pick-to-placement path, in which all the sucking rods, after completing the picking, move to the circuit board from the base of the component feeder in the current period, where the start point is the last pick point of the current period, and its end point is a first placement point in the current period; 3) a placement path, in which the sucking rods complete the mounting of the components sequentially in the current period, where its start point and end point both are placement points; 4) a mount-to-pick path, in which all sucking rods, after completing the mounting, move to the base of the component feeder from the circuit board in the current period, where its start point is the last placement point in the current period and its end point is the first pick point in the next period.

After the "component distribution" and "position distribution of the component feeder" are determined, the pick path will be uniquely determined, and the minimization of the pick-to-placement path, the placement path, and the mount-to-pick path depend on "optimization of the pick-and-place path". In the mounting production process of the surface mount machine, "the result of the component distribution" and "position distribution result of the component feeder" cannot be modified whereas the "optimization result of the pick-and-place path" can be improved continuously along with the production process. In the present disclosure, it is firstly proposed that in the production process, the length of the pick-and-place path is minimized by performing continuous improvement on "placement point distribution" and "placement sequence", while an effective optimization method is given correspondingly.

SUMMARY

In order to address the problem of too long pick-and-place path resulting from poor optimal solution search capability when the existing surface mount machine performs optimization based on a heuristic algorithm by calling software and the problem of inability to perform online optimization and update due to adoption of fixed optimization result in production, the present disclosure provides a method of performing online optimization on a pick-and-place path during the production of a surface mount machine.

There is provided a method of performing online optimization on a pick-and-place path during the production of a surface mount machine, which includes the following steps:

at step 1, based on a mount optimization solver of the surface mount machine, obtaining an initial mount process optimization result, and transmitting the result into an industrial control computer of the surface mount machine to start surface mount production;

at step 2, obtaining surface mount machine parameters, circuit board production data, and an initial pick-and-place path optimization result from the pick-and-place process optimization result;

at step 3, based on the imported initial pick-and-place path optimization result, determining candidate positions for placement points of various types of components, along with the initial sequence array of placement points for these components.

at step 4, performing initialization on tabu search;

at step 5, employing the tabu search to compare and select optimal results for pick-and-place path optimization, transmitting the newly found optimal result to the industrial control computer of the surface mount machine, and based on this result, commencing subsequent surface mount production starting from the next circuit board;

at step 6, performing neighborhood search operations on arrays of assignment sequences for various types of components, decoding the manipulated assignment sequence arrays to obtain new placement point distribution results and correspondingly, obtaining optimal placement sequencing results based on dynamic programming; if the new optimization results correspond to a better pick-and-place path, storing it as the optimal result.

Furthermore, the process of obtaining the surface mount machine parameters, the circuit board production data and the initial pick-and-place path optimization result comprises the following steps:

at step 21, the surface mount machine parameters are imported, wherein the surface mount machine parameters comprise a total number H of sucking rods, an index of each sucking rod is numbered as $h \in [1, \ldots, H]$ in a sequence of increasing along X axis, and a spacing between the sucking rods is DI;

at step 22, the circuit board production data is imported; wherein the circuit board production data comprises: a total number C of component types, the index serial number of each type of components $c \in [1, \ldots, C]$, a number of the contained placement points $n\{c\} \in [n\{1\}, \ldots, n\{C\}]$, a total number P of placement points, and an index serial number of each placement point $p \in [1, \ldots, P]$, coordinates of the placement points are stored in a two-dimensional array xyt with a row number P and a column number 2, wherein the X coordinate and Y coordinate of the P-th placement point are $xyt(p,1)$ and $xyt(p,2)$ respectively; the coordinate of the placement points becomes a mount coordinate corresponding to the placement points only after being transformed into a fixed reference point coordinate on a surface mount carrier;

at step 23, the initial pick-and-place path optimization result is imported; the total number of the PAP cycles is K and the index serial number of each PAP cycle is $k \in [1, \ldots, K]$; the component distribution result is stored in a two-dimensional array CG with a row number K and a column number H, wherein the component CG(k,h) represents an component type picked and mounted by the h-th sucking rod in the K-th PAP cycle, namely, $CG(k,h) \in [1, \ldots, C]$; the placement point distribution result is stored in a two-dimensional array PA0 with a row number K and a column number H, wherein the component PA0(k,h) represents a placement point number mounted by the h-th sucking rod in the k-th PAP cycle, namely, $PA0(k,h) \in [1, \ldots, P]$; the placement sequence result is stored in a two-dimensional array PS0 with a row number K and a column number H, wherein the component PS0(k,s) represents an s-th sucking rod number performing mounting in the k-th PAP cycle, namely, $PS0(k,s) \in [1, \ldots, H]$; the pick-and-place path length is DZ0, and the pick path length is DQ; pick coordinates corresponding to the first and the last pick points in each PAP cycle are stored in two-dimensional arrays xyqf and xyql with a row number K and a column number 2, wherein the components xyqf(k,1) and xyqf(k,2) represent the X coordinate and the Y coordinate of the pick coordinate corresponding to the first pick point in the k-th PAP cycle, and the components xyql(k,1) and xyql(k,2) represent the X coordinate and the Y coordinate of the pick coordinate corresponding to the last pick point in the k-th PAP cycle.

Furthermore, the process of obtaining the candidate positions of the placement points contained by each type of component and the sequence array of the initial placement points of each type of component comprises the following steps:

at step 31, the PAP cycle count k=1 is initialized; corresponding to each type of component $c \in [1, \ldots, C]$, an array $PL\{c\} \in [PL\{1\}, \ldots, PL\{C\}]$ with a row number n{c} and a column number 2 with all components being zero is initialized to store the candidate positions of the placement points contained by each type of components, wherein PL{c} is referred to as a candidate position array of the components of the c-th type; corresponding to each type of components $c \in [1, \ldots, C]$, an array $ps0\{c\} \in [ps0\{1\}, \ldots, ps0\{C\}]$ with a row number n{c} and a column number 1 with all components being zero is initialized to store the placement point assignment sequence of each type of components, wherein ps0{c} is referred to as a assignment sequence array of the components of the c-th type; corresponding to each type of components $c \in [1, \ldots, C]$, a count variable i{c}=1 is initialized as an index of the placement points of each type of components;

at step 32, if k>K, it indicates that one traversal has been completed for all PAP cycles, and step 4 is performed, and otherwise, a sucking rod count variable h=1 is initialized and step 33 is performed;

at step 33, if h>H, it indicates that one traversal has been completed for all sucking rods, cyclic variable k=k+1 is updated and the step 32 is repeated, and otherwise, step 34 is performed;

at step 34, the component type picked and mounted by the h-th sucking rod in the k-th PAP cycle is c=CG(k,h), and it is determined whether c=0 is present; if yes, it indicates that the sucking rod in this period does not perform any mounting, the cyclic variable h=h+1 is updated, and step 33 is repeated, and otherwise, step 35 is performed;

at step 35, PL{c}(i{c},1)=k and PL{c}(i{c},2)=h are assigned and ps0{c}(i{c})=PA0(k,h) is also assigned; the count variable i{c}=i{c}+1 is updated, and cyclic variable h=h+1 is updated, and step 33 is repeated.

Furthermore, the process of performing initialization on tabu search comprises the following steps:

at step 41, an upper limit of the number of times of local search is initialized and assigned to IT=⌈(P)$^{0.5}$⌉, wherein the symbol ⌈ ⌉ represents performing up-rounding for a value inside; the component type count c=1 is initialized;

at step 42, if c>C, it indicates that one traversal has been completed for all component types, and step 48 is performed and otherwise, step 43 is performed.

at step 43, the number of times that the components of the c-th type perform swap operation is SWN{c}=0.5*n{c}*(n{c}−1); an array SWL{c} with a row number SWN{c} and a column number 2 with all components being zero is initialized to store swap operations the components of the c-th type perform; a swap operation count swn=0 is initialized; a prior placement point count ni=1 is initialized;

at step 44, if ni>n{c}−1, it indicates that one traversal has been completed for all prior placement points, and step 47 is performed; and otherwise, a posterior placement point count nj=ni+1 is initialized and step 45 is performed;

at step 45, if nj>n{c}, it indicates that one traversal has been completed for all posterior placement points, and the count variable ni=ni+1 is updated, and step 44 is repeated, and otherwise, step 46 is performed;

at step 46, the count variables swn=swn+1, SWL{c}(swn,:)=[ni,nj] are updated, and the count variable nj=nj+1 is updated and step 45 is repeated;

at step 47, an array TC{c} with a row number SWN{c} and a column number 1 with all components being zero is initialized as a tabu table for the components of the c-th type, wherein each component in this array indicates whether the corresponding swap operation is disabled or not and a number of times of disabling, and an upper limit of the number of times of disabling is TL{c}=⌈(n{c})$^{0.5}$⌉; the count variable c=c+1 is updated and step 42 is repeated;

at step 48, an array swb with a row number C and a column number 1 with all components being zero is initialized to store an optimal swap operation of each type of component; an array swt with a row number C and a column number 1 with all components being zero is initialized to store a non-disabled optimal swap operation of each type of components.

Furthermore, the specific process of performing comparison on the pick-and-place path optimization results to select an optimal one and transmitting the newly-obtained optimal result into the industrial control computer of the surface mount machine, and then by starting from a next circuit board, performing subsequent surface mount production based on the result comprises the following steps:

at step 51, a historical optimal pick-and-place path length DZ, a currently-solved pick-and-place path length DZb, a currently-solved placement point distribution result PAb, and a currently-solved placement sequence result PSb are initialized, and DZ=DZ0, DZb=DZ0, PAb=PA0, PSb=PS0 are assigned; corresponding to each type of components c∈[1, . . . , C], ps{c}=ps0{c} and psb{c}=ps{c} are initialized and assigned to store an optimal assignment sequence, and pst{c}=ps{c} is initialized and assigned to store a non-disabled optimal assignment sequence; a non-improved search count variable IM=0 is initialized and assigned;

at step 52, if IM>IT, it indicates that the number of times of the non-improved search reaches an upper limit, and step 51 is performed to start a next round of search, and otherwise, the non-disabled shortest path length DZt is initialized to infinity, the local search count variable it=1 is initialized and step 53 is performed;

at step 53, if it>IT, it indicates that the number of times of the local search reaches the upper limit and step 54 is performed; and otherwise, corresponding to each type of components $c_1$∈[1, . . . , C], psn{$c_1$}=ps{$c_1$} is initialized and assigned; the component type count c=1 is initialized, and step 6 is performed;

at step 54, it is determined whether DZb<DZ; if yes, it indicates that a better pick-and-place path is obtained, and step 55 is performed and otherwise, step 56 is performed;

at step 55, the optimal result is updated and then transmitted into the industrial control computer of the surface mount machine, and by starting from a next circuit board, subsequent surface mount production is performed based on the result;

at step 56, the non-disabled optimal result is updated.

Furthermore, the process that the optimal result is updated and then transmitted into the industrial control computer of the surface mount machine and by starting from the next circuit board, subsequent surface mount production is performed based on the result in the step 55 comprises the following steps:

at step 551, IM=0 is updated, the optimal results DZ=DZb, PA=PAb, PS=PSb are updated; corresponding to each type of components $c_1$∈[1, . . . , C], ps{$c_1$}=psb{$c_1$} is updated and the optimal result is transmitted into the industrial control computer of the surface mount machine and by starting from a next circuit board, subsequent surface mount production is performed based on the result; the component type count c=1 is initialized;

at step 552, if c>C, it indicates that one traversal has been completed for all component types, the count variable IM=IM+1 is updated, and step 52 is repeated, and otherwise, the swap operation count swn=1 is initialized and step 553 is performed;

at step 553, if swn>SWN{c}, it indicates that one traversal has been completed for all swap operations, and the count variable c=c+1 is updated, and step 552 is repeated and otherwise, step 554 is performed;

at step 554, the component TC{c}(swn) in the tabu table is updated: it is determined whether swn=swb(c) is present; if yes, TC{c}(swn)=TL{c} is updated, and otherwise, TC{c}(swn)=max(TC{c}(swn)−1,0), wherein max represents selecting the greater of the array in the parentheses after max; if a determination is completed, the count variable swn=swn+1 is updated and step 553 is performed.

Furthermore, the process that the non-disabled optimal result in the step 56 is updated comprises the following steps:

at step 561, corresponding to each type of components $c_1$∈[1, . . . , C], ps{$c_1$}=pst{$c_1$} is updated; and the component type count c=1 is initialized;

at step 562, if c>C, it indicates that one traversal has been completed for all component types, the count variable IM=IM+1 is updated and step 52 is repeated; and otherwise, the swap operation count swn=1 is initialized and step 563 is performed;

at step 563, if swn>SWN{c}, it indicates that one traversal has been completed for all swap operations, the count variable c=c+1 is updated and step 562 is repeated, and otherwise, step 564 is performed;

at step 564, the component TC{c} (swn) in the tabu table is updated: it is determined whether swn=swt(c) is present; if yes, TC{c}(swn)=TL{c} is updated, and otherwise, TC{c}(swn)=max(TC{c}(swn)−1,0); after the determination is completed, the count variable swn=swn+1 is updated and step 563 is performed.

Furthermore, the specific process of performing neighborhood search operation on the assignment sequence array of each type of component and decoding the operated assignment sequence array to obtain a new placement point distribution result, and then correspondingly obtaining an optimal placement sequence result based on dynamic planning; if the new optimization result corresponds to a better pick-and-place path, storing the optimization result as an optimal result comprises the following steps:

at step 61, if c>C, it indicates that one traversal has been completed for all component types, the count variable it=it+1 is updated, and step 53 is repeated, and otherwise, step 62 is performed;

at step 62, an ongoing operation swi∈[1, . . . , SWN{c}] is randomly selected, and the two components to be swapped are ni=SWL{c} (swi,1) and nj=SWL{c}(swi, 2), and the swap is as follows: psn{c}(ni)=ps{c}(nj) and psn{c}(nj)=ps{c}(ni);

at step 63, the swapped assignment sequence array is decoded to obtain a new placement point distribution result;

at step 64, dynamically-planned initialization is performed, which comprises the following steps:

at step 641, if k>K, step 67 is performed and otherwise, the sucking rod count h=1 is initialized, the mount coordinate count variable S=0 is initialized, the mount sucking rod array hs is initialized as an empty array, the mount coordinate array pt is initialized as an empty array, and the step 642 is performed to calculate all mount coordinates in the present period;

at step 642, if h>H, step 644 is performed and otherwise, step 643 is performed;

at step 643, the placement point p=PAn(k,h) mounted by the h-th sucking rod in the k-th PAP cycle is obtained; if p=0, no processing is performed; and otherwise, the mount sucking rod array hs=[hs h] is updated and the count variable S=S+1 is updated, and the mount coordinates pt(S,1)=xyt(p,1)−(h−1)*DI and pt(S,2)=xyt(p,2) are updated; the count variable h=h+1 is updated and step 642 is repeated;

at step 644, an array dt with a row number and a column number both being S with all components being zero is initialized to store a distance between the mount coordinates, and taken as a mount distance array; an array df with a row number 1 and a column number S with all components being zero is initialized to store a distance between each mount coordinate and the last pick coordinate in the k-th PAP cycle, and taken as a pick-to-mount distance array; an array dw with a row number 1 and a column number S with all components being zero is initialized to store a distance between each mount coordinate and the first pick coordinate in the (k+1)-th PAP cycle, and taken as a mount-to-pick distance array; a prior placement point count $s_1$=1 is initialized;

at step 645, if $s_1$>S, it indicates that one traversal has been completed for all prior placement points and step 640 is performed and otherwise, the posterior placement point count $s_2$=$s_1$+1 is initialized to and step 646 is performed;

at step 646, dx=|pt($s_1$,1)−xyql(k,1)| and dy=|pt($s_1$,2)−xyql(k,2)| are calculated, wherein symbol || represents an absolute value of a value therein; and the pick-to-mount distance df($s_1$)=max(dx,dy) is calculated;

at step 647, dx=|pt($s_1$,1)−xyqf(k+1,1)| and dy=|pt($s_1$,2)−xyqf(k+1,2)| are calculated, and the mount-to-pick distance dw($s_1$)=max(dx,dy) is calculated;

at step 648, if $s_2$>S, it indicates that one traversal has been completed for all posterior placement points, and the count variable $s_1$=$s_1$+1 is updated, and step 645 is repeated, and otherwise, step 649 is performed;

at step 649, dx=|pt($s_1$,1)−pt($s_2$,1)| and dy=|pt($s_1$,2)−pt($s_2$,2)| are calculated, the mount distance dt($s_1$,$s_2$)=dt($s_2$,$s_1$)=max(dx,dy) is calculated, the count variable $s_2$=$s_2$+1 is updated, and step 648 is repeated;

at step 640, the dynamically-planned column number V=max(1,S−2) is initialized and assigned; full permutation of 1 to S is generated as M, and the array U=[1!, . . . , S!] is initialized and assigned, wherein the symbol ! refers to performing factorial on a previous value; an array dd with a row number U(S) and a column number V with all components being zero is initialized to store a path length corresponding to each dynamically-planned node, and taken as a dynamically-planned distance array, and dd(:,1)=df(M(:,1))+dw(M(:,S)) is updated; the permutation count u=0 is initialized and the updated leftmost column count $V_1$=1 is initialized; an array J with a row number 1 and a column number V with all components being zero is initialized as the leftmost column tag array; step 65 is performed;

at step 65, based on dynamic planning, the optimal placement sequence in the k-th PAP cycle is obtained.

Furthermore, the process of decoding the swapped assignment sequence array to obtain the new placement point distribution result in step 63 comprises the following steps:

at step 631, the component type count $c_1$=1 is initialized; the updated placement point distribution result PAn, the updated placement sequence result PSn, and the updated pick-and-place path length DZn are initialized, and PAn=PAb, PSn=PSb and DZn=DQ are assigned to store a newly-obtained pick-and-place path optimization result;

at step 632, if $c_1$>C, it indicates that one traversal has been completed for all component types, the PAP cycle count k=1 is initialized, and step 64 is performed; and otherwise, the placement point count ii=1 of the components of the $c^1$-th type is initialized and step 633 is performed;

at step 633, if ii>n{$c^1$}, it indicates that one traversal has been completed for all placement points of the components of the $c_1$-th type, and the count variable $c_1$=$c_1$+1 is updated, and step 632 is repeated; and otherwise, step 634 is performed;

at step 634, the candidate positions k=PL{$c_1$}(ii,1) and h=PL{$c_1$}(ii,2) are obtained, the placement point distribution result PAn(k,h)=psn{$c_1$}(ii) is updated, and the count variable ii=ii+1 is updated, and step 633 is repeated.

Furthermore, the process of, based on dynamic planning, obtaining the optimal placement sequence in the k-th PAP cycle in step 65 comprises the following steps:

- at step 651, if u>U(S), it indicates that one traversal has been completed for all permutations and step 66 is performed, and otherwise, step 652 is performed;
- at step 652, the count variable u=u+1 is updated and the column count v=$V_1$ is initialized and updated;
- at step 653, if v>V, it indicates that one traversal has been completed for all columns, and step 657 is performed and otherwise, step 654 is performed;
- at step 654, the indexes of two mount coordinates to be calculated for a spacing therebetween are $s_1$=M(u,v) and $s_2$=M(u,v+1); the to-be-updated maximum row number of the dynamically-planned distance array is $U_1$=u+U(V+1−v)−1; $u_1$=u is initialized;
- at step 655, if $u_1$>$U_1$, $s_1$=M(u,S−1), $s_2$=M(u,S), dd(u,V)=dd(u,V)+dt($s_1$,$s_2$) are updated, and the count variable v=v+1 is updated and step 653 is repeated, and otherwise, step 656 is performed;
- at step 656, the minimum column number to be summed in the dynamically-planned distance array is $v^1$=max(1,v−1), and dd($u_1$,v)=sum(dd($u_1$,$v_1$:v))+dt($s_1$,$s_2$) is updated, wherein sum represents performing summing for the array in the parentheses; the count variable $u_1$=$u_1$+1 is updated and step 655 is repeated;
- at step 657, J(1)=J(1)+1 is updated and the column count v=1 is initialized and updated;
- at step 658, if v>V, $V_1$=V+1−$v_2$, and step 651 is repeated and otherwise, step 659 is performed;
- at step 659, if J(v)≤U(v), $v_2$=v and v=V+1, and step 658 is repeated, and otherwise, step 6510 is performed;
- at step 6510, if v<V, J(v+1)=J(v+1)+U(v) and J(v)=0 are updated, and otherwise, no processing is performed; the count variable v=v+1 is updated and step 658 is repeated;
- at step 66, [dm,um]=min(dd(:,V)) is obtained, wherein min represents a minimum value of the array in the parentheses after min, dm is a minimum pick-and-place path, um is a permutation index for achieving the minimum pick-and-place path, and the optimal placement sequence of the k-th PAP cycle is PSn(k,1:S)=hs(M(um,:)), and DZn=DZn+dm; the count variable k=k+1 is updated, and step 641 is repeated;
- at step 67, it is determined whether DZn<DZb is present; if yes, DZb=DZn, swb(c)=swi, PAb=Pan, PSb=PSn are updated; corresponding to each type of components $c_1$∈[1, . . . , C], psb{$c_1$}=psn{$c_1$} is updated, and otherwise, no processing is performed;
- at step 68, it is determined whether TC{c}(swi)=0 is present and whether DZn<DZt; if yes, it indicates the current swap operation is not disabled, and the obtained result is superior to the non-disabled shortest path, and DZt=DZn and swt(c)=swi are updated; corresponding to each type of components $c_1$∈[1, . . . , C], pst{$c_1$}=psn{$c_1$} is updated, and if not, no processing is performed;
- at step 69, the count variable c=c+1 is updated and step 61 is repeated.

The present disclosure has the following beneficial effects.

The present disclosure provides a method of performing online optimization on a pick-and-place path during the production of a surface mount machine. In this method, after surface mount production is quickly carried out based on the initial optimization result, the placement point assignment sequence in each type of component is optimized based on tabu search algorithm, and then based on the obtained placement point distribution result, an optimal placement sequence result is obtained based on dynamical planning; if the result corresponds to a better pick-and-place path, based on the result, subsequent surface mount production is performed. Thus, the above optimization is continuously performed during the production of the surface mount machine, so as to maximize the mount production efficiency. In this way, the problem of too long a pick-and-place path resulting forms poor optimal solution search capability in the prior arts can be solved, and online optimization and update can also be performed. Experiments show that the method provided by the present disclosure can greatly increase the production efficiency of the surface mount machine with the maximum efficiency increased by 11.78%. The optimization method provided by the present disclosure is generally applicable to various surface mount machines with different surface mount carriers.

BRIEF DESCRIPTIONS OF THE DRAWINGS

For ease of description, the present disclosure will be detailed in combination with the following embodiments and drawings.

DETAILED DESCRIPTIONS OF EMBODIMENTS

Figure 1:
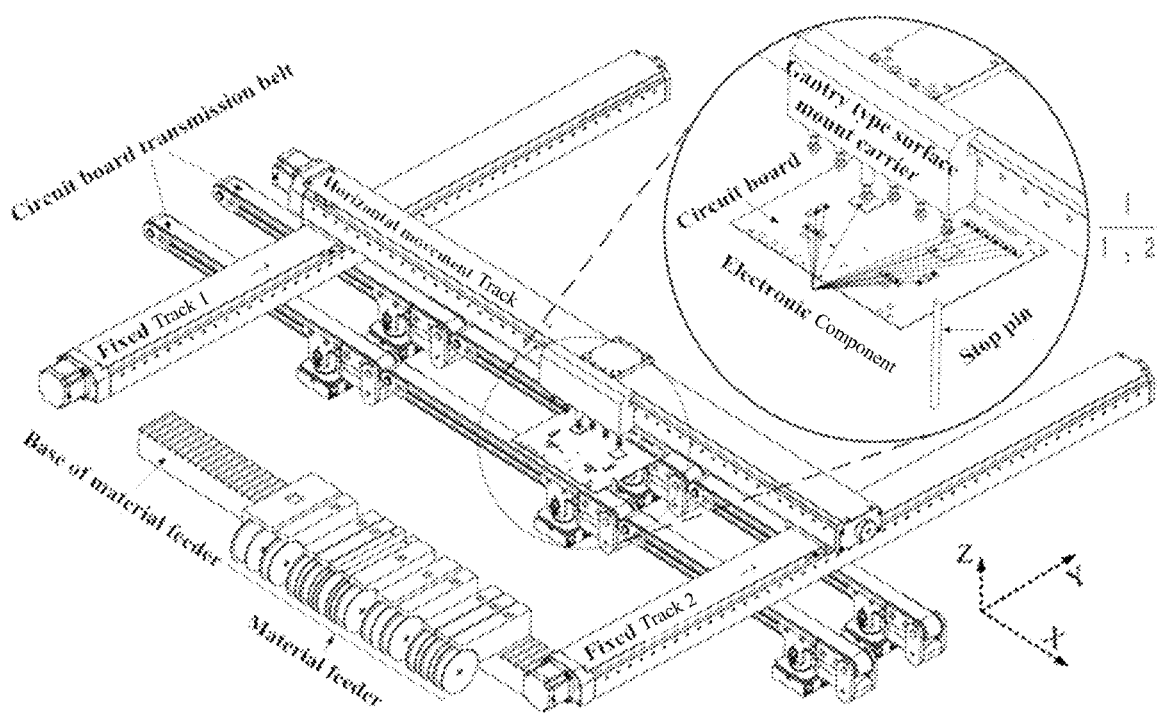
FIG. 1 is a schematic diagram illustrating a surface mount machine with a gantry type surface mount carrier.
Figure 2:
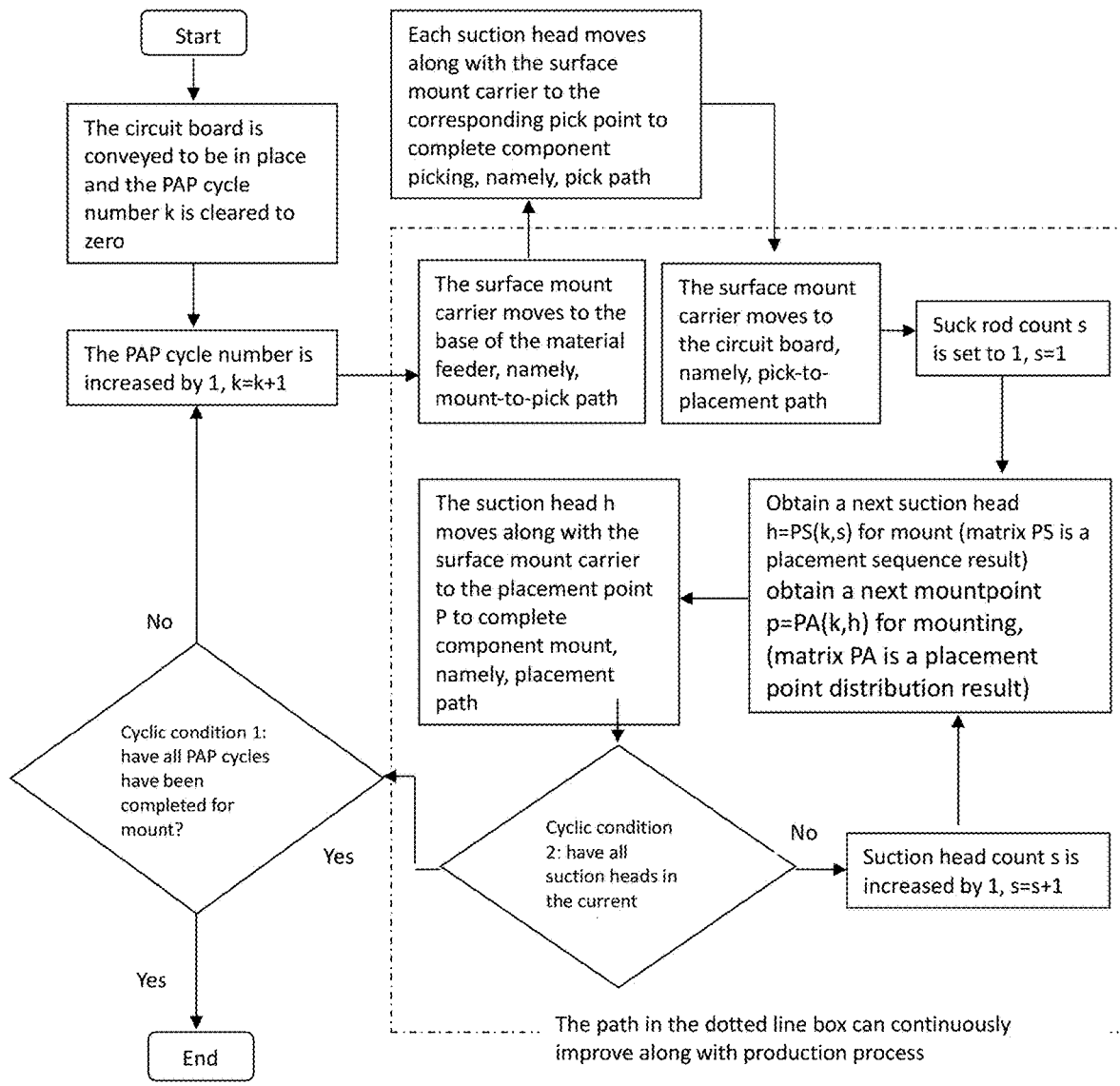
FIG. 2 is a flowchart illustrating a pick-mount process of a surface mount machine.

In order to make the objects, technical solutions, and advantages of the present disclosure clearer and more intelligible, the present disclosure will be set forth by referring to the specific embodiments shown in the drawings. But, it should be understood that these descriptions are only illustrative rather than limiting of the present disclosure. Furthermore, in the following descriptions, the descriptions of the well-known structures and technologies are omitted to avoid unnecessary confusion about the concepts of the present disclosure.

Furthermore, it is to be noted that, in order to avoid obscuring the present disclosure due to unnecessary details, structures and/or processing steps closely related to the solutions of the present disclosure are only illustrated while other details not closely related to the present disclosure are omitted.

Figure 3:
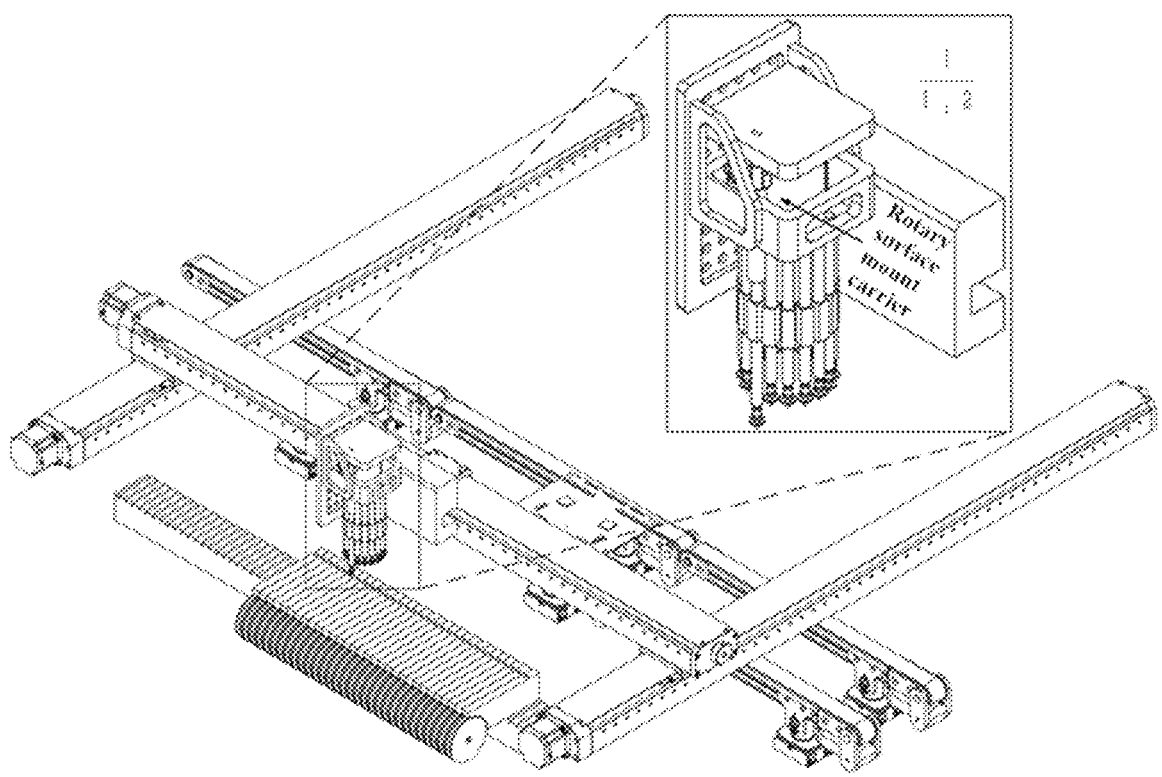
FIG. 3 is a schematic diagram illustrating a surface mount machine with a rotary surface mount carrier.

It is to be noted that the surface mount carriers can be divided into two types: gantry type surface mount carrier (FIG. 1) and rotary surface mount carrier (FIG. 3). The mount optimizations of the surface mount machine using the two types of surface mount carriers may be different but they require that the above three problems should be solved. The present disclosure is applicable to the surface mount machine with the two types of surface mount carriers. Therefore, the embodiments will be provided based on the gantry type surface mount carrier shown in FIG. 1.

Figure 4:
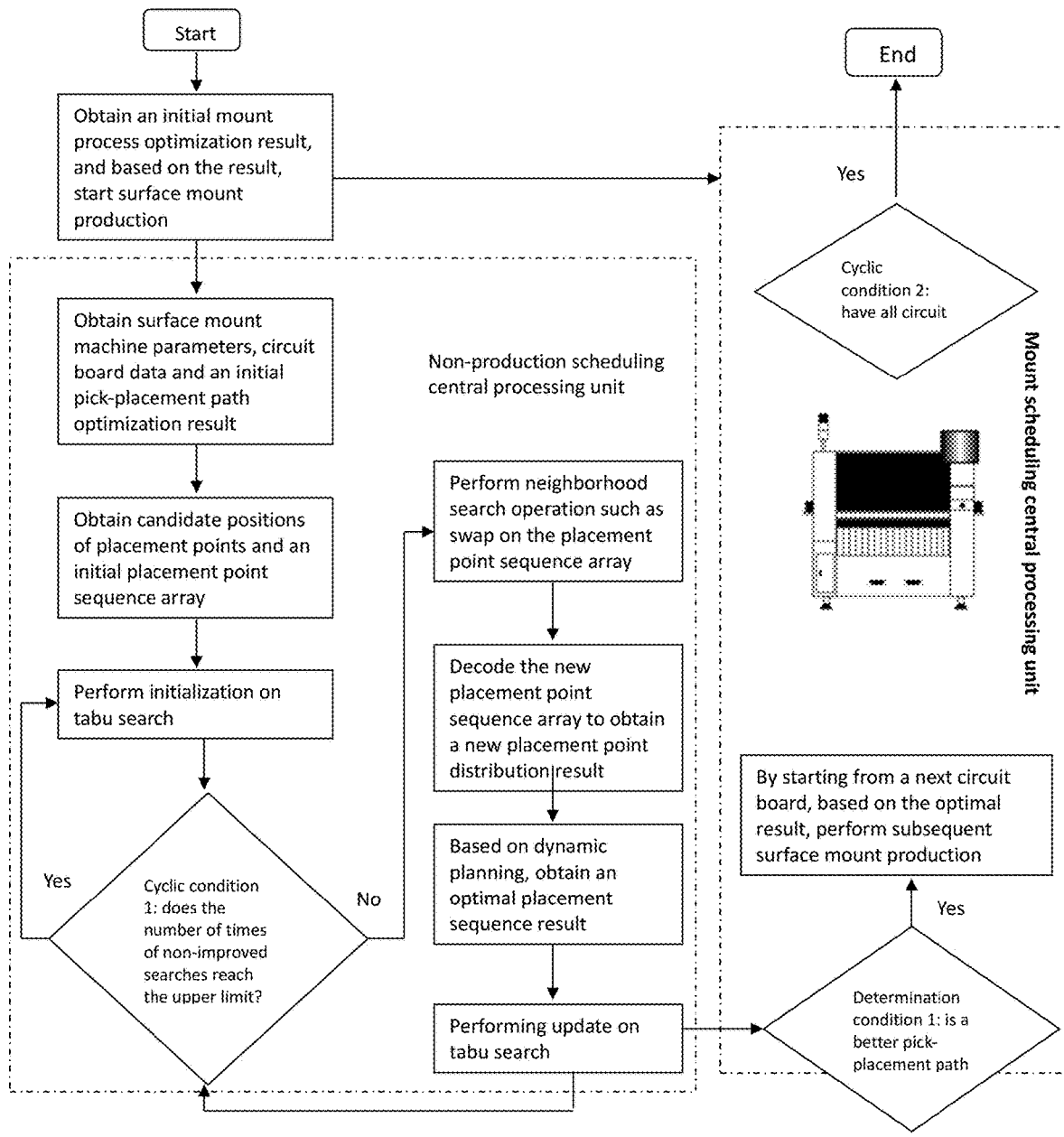
FIG. 4 is a flowchart illustrating a pick-and-place path optimization method of a surface mount machine according to an embodiment of the present disclosure.

Embodiment 1: the present embodiment will be described in combination with FIG. 4.

This embodiment provides a method of performing online optimization on a pick-and-place path during the production of a surface mount machine, which includes the steps:

At step 1, an initial pick-and-place process optimization result is obtained, and based on the result, surface mount production is performed.

The process of obtaining the initial pick-and-place process optimization result is obtained and based on the result, performing surface mount production includes the following steps:

At step 11, based on the mount optimization solver of the existing surface mount machine, an initial pick-and-place process optimization result is obtained.

At step 12, the result is transmitted into an industrial control computer of the surface mount machine and based on the result, surface mount production is started.

At step 13, the result is transmitted into a non-production scheduling central processing unit to perform step 2, such that the pick-and-place path optimization result is continuously improved while the surface mount production is carried out.

The non-production scheduling central processing unit may be another central processing unit in the industrial control computer of the surface mount machine or a server or another industrial control computer forming a communication network with the industrial control computer of the surface mount machine.

At step 2, surface mount machine parameters, circuit board production data, and an initial pick-and-place path optimization result are obtained from the pick-and-place process optimization result.

The process of obtaining the surface mount machine parameters, the circuit board production data and the initial pick-and-place path optimization result comprises the following steps:

At step 21, the surface mount machine parameters are imported, wherein the surface mount machine parameters comprise a total number H of sucking rods, an index of each sucking rod is numbered as $h \in [1, \ldots, H]$ in a sequence of increasing along X axis, and a spacing between the sucking rods is DI.

At step 22, the circuit board production data is imported; wherein the circuit board production data comprises: a total number C of component types, the index serial number of each type of component $c \in [1, \ldots, C]$, a number of the contained placement points $n\{c\} \in [n\{1\}, \ldots, n\{C\}]$, a total number P of placement points, and an index serial number of each placement point $p \in [1, \ldots, P]$, coordinates of the placement points are stored in a two-dimensional array xyt with a row number P and a column number 2, wherein the X coordinate and Y coordinate of the P-th placement point are xyt(p,1) and xyt(p,2) respectively. It should be noted that the coordinate of the placement points becomes a mount coordinate corresponding to the placement points only after being transformed into a fixed reference point coordinate on the surface mount carrier. For the gantry type surface mount carrier in the embodiment of the present disclosure, its fixed reference point is a central point of the first sucking rod; when the h-th sucking rod performs mounting above the placement points, the X coordinate of the mount coordinate is xyt(p,1)−(h−1)*DI, and the T coordinate is xyt(p,2).

At step 23, the initial pick-and-place path optimization result is imported; the total number of the PAP cycles is K and the index serial number of each PAP cycle is $k \in [1, \ldots, K]$; the component distribution result is stored in a two-dimensional array CG with a row number K and a column number H, wherein the component CG(k,h) represents an component type picked and mounted by the h-th sucking rod in the K-th PAP cycle, namely, $CG(k,h) \in [1, \ldots, C]$; the placement point distribution result is stored in a two-dimensional array PA0 with a row number K and a column number H, wherein the component PA0(k,h) represents a placement point number mounted by the h-th sucking rod in the k-th PAP cycle, namely, $PA0(k,h) \in [1, \ldots, P]$; the placement sequence result is stored in a two-dimensional array PS0 with a row number K and a column number H, wherein the component PS0(k,s) represents an s-th sucking rod number performing mounting in the k-th PAP cycle, namely, $PS0(k,s) \in [1, \ldots, H]$; the pick-and-place path length is DZ0, and the pick path length is DQ; pick coordinates corresponding to the first and the last pick points in each PAP cycle are stored in two-dimensional arrays xyqf and xyql with a row number K and a column number 2, wherein the components xyqf(k,1) and xyqf(k,2) represent the X coordinate and the Y coordinate of the pick coordinate corresponding to the first pick point in the k-th PAP cycle, and the components xyql(k,1) and xyql(k,2) represent the X coordinate and the Y coordinate of the pick coordinate corresponding to the last pick point in the k-th PAP cycle.

At step 3, based on the imported initial pick-and-place path optimization result, determining candidate positions for placement points of various types of components, along with the initial sequence array of placement points for these components.

The process of obtaining the candidate positions of the placement points contained by each type of component and the sequence array of the initial placement points of each type of component comprises the following steps:

at step 31, the PAP cycle count k=1 is initialized; corresponding to each type of component $c \in [1, \ldots, C]$, an array $PL\{c\} \in [PL\{1\}, \ldots, PL\{C\}]$ with a row number n{c} and a column number 2 with all components being zero is initialized to store the candidate positions of the placement points contained by each type of components, wherein PL{c} is referred to as a candidate position array of the components of the c-th type; corresponding to each type of components $c \in [1, \ldots, C]$, an array $ps0\{c\} \in [ps0\{1\}, \ldots, ps0\{C\}]$ with arow number n{c} and a column number 1 with all components being zero is initialized to store the placement point assignment sequence of each type of components, wherein ps0{c} is referred to as a assignment sequence array of the components of the c-th type; corresponding to each type of components $c \in [1, \ldots, C]$, a count variable i{c}=1 is initialized as an index of the placement points of each type of components;

at step 32, if k>K, it indicates that one traversal has been completed for all PAP cycles, and step 4 is performed, and otherwise, a sucking rod count variable h=1 is initialized and step 33 is performed;

at step 33, if h>H, it indicates that one traversal has been completed for all sucking rods, cyclic variable k=k+1 is updated and the step 32 is repeated, and otherwise, step 34 is performed;

at step 34, the component type picked and mounted by the h-th sucking rod in the k-th PAP cycle is c=CG(k,h), and it is determined whether c=0; if yes, it indicates that the sucking rod in this period does not perform any mounting, the cyclic variable h=h+1 is updated, and step 33 is repeated, and otherwise, step 35 is performed;

at step 35, PL{c}(i{c},1)=k and PL{c}(i{c},2)=h are assigned and ps0{c}(i{c})=PA0(k,h) is also assigned; the count variable i{c}=i{c}+1 is updated, and cyclic variable h=h+1 is updated, and step 33 is repeated.

At step 4, initialization on tabu search is performed.

The process of performing initialization on tabu search comprises the following steps:

at step 41, an upper limit of the number of times of local search is initialized and assigned to IT=⌈(P)$^{0.5}$⌉, wherein the symbol ⌈ ⌉ represents performing up-rounding for a value inside; the component type count c=1 is initialized;

at step 42, if c>C, it indicates that one traversal has been completed for all component types, and step 48 is performed and otherwise, step 43 is performed;

at step 43, the number of times that the components of the c-th type perform swap operation is SWN{c}=0.5*n{c}*(n{c}−1); an array SWL{c} with a row number SWN{c} and column number 2 with all components being zero is initialized to store swap operations the components of the c-th type perform; a swap operation count swn=0 is initialized; a prior placement point count ni=1 is initialized;

at step 44, if ni>n{c}−1, it indicates that one traversal has been completed for all prior placement points, and step 47 is performed; and otherwise, a posterior placement point count nj=ni+1 is initialized and step 45 is performed;

at step 45, if nj>n{c}, it indicates that one traversal has been completed for all posterior placement points, and the count variable ni=ni+1 is updated, and step 44 is repeated, and otherwise, step 46 is performed;

at step 46, the count variables swn=swn+1, SWL{c}(swn,:)=[ni,nj] are updated, and the count variable nj=nj+1 is updated and step 45 is repeated;

at step 47, an array TC{c} with a row number SWN{c} and a column number 1 with all components being zero is initialized as a tabu table for the components of the c-th type, wherein each component in this array indicates whether the corresponding swap operation is disabled or not and a number of times of disabling, and an upper limit of the number of times of disabling is TL{c}=⌈(n{c})$^{0.5}$⌉; the count variable c=c+1 is updated and step 42 is repeated;

at step 48, an array swb with a row number C and a column number 1 with all components being zero is initialized to store an optimal swap operation of each types of component; an array swt with a row number C and a column number 1 with all components being zero is initialized to store a non-disabled optimal swap operation of each types of components.

At step 5, employing the tabu search to compare and select optimal results for pick-and-place path optimization, transmitting the newly found optimal result to the industrial control computer of the surface mount machine, and based on this result, commencing subsequent surface mount production starting from the next circuit board.

The specific process of, based on the tabu search, performing comparison on the pick-and-place path optimization results to select an optimal one and transmitting the newly-obtained optimal result into the industrial control computer of the surface mount machine, and then by starting from a next circuit board, performing subsequent surface mount production based on the result comprises the following steps:

at step 51, a historical optimal pick-and-place path length DZ, a currently-solved pick-and-place path length DZb, a currently-solved placement point distribution result PAb, and a currently-solved placement sequence result PSb are initialized, and DZ=DZ0, DZb=DZ0, PAb=PA0, PSb=PS0 are assigned; corresponding to each type of components c∈[1, ..., C], ps{c}=ps0{c} and psb{c}=ps{c} are initialized and assigned to store an optimal assignment sequence, and pst{c}=ps{c} is initialized and assigned to store a non-disabled optimal assignment sequence; a non-improved search count variable IM=0 is initialized and assigned;

at step 52, if IM>IT, it indicates that the number of times of the non-improved search reaches an upper limit, and step 51 is performed to start a next round of search, and otherwise, the non-disabled shortest path length DZt is initialized to infinity, the local search count variable it=1 is initialized and step 53 is performed;

at step 53, if it>IT, it indicates that the number of times of the local search reaches the upper limit and step 54 is performed; and otherwise, corresponding to each type of components $c_1$∈[1, ..., C], psn{$c_1$}=ps{$c_1$} is initialized and assigned; the component type count c=1 is initialized, and step 6 is performed;

at step 54, it is determined whether DZb<DZ; if yes, it indicates that a better pick-and-place path is obtained, and step 55 is performed and otherwise, step 56 is performed;

at step 55, the optimal result is updated and then transmitted into the industrial control computer of the surface mount machine and by starting from a next circuit board, subsequent surface mount production is performed based on the result, which includes the following steps:

at step 551, IM=0 is updated, the optimal results DZ=DZb, PA=PAb, PS=PSb are updated; corresponding to each type of components $c_1$∈[1, ..., C], ps{$c_1$}=psb{$c_1$} is updated and the optimal result is transmitted into the industrial control computer of the surface mount machine and by starting from a next circuit board, subsequent surface mount production is performed based on the result; the component type count c=1 is initialized;

at step 552, if c>C, it indicates that one traversal has been completed for all component types, the count variable IM=IM+1 is updated, and step 52 is repeated, and otherwise, the swap operation count swn=1 is initialized and step 553 is performed;

at step 553, if swn>SWN{c}, it indicates that one traversal has been completed for all swap operations, and the count variable c=c+1 is updated, and step 552 is repeated and otherwise, step 554 is performed;

at step 554, the component TC{c}(swn) in the tabu table is updated: it is determined whether swn=swb(c) is present; if yes, TC{c}(swn)=TL{c} is updated, and otherwise, TC{c}(swn)=max(TC{c}(swn)−1,0), wherein max represents selecting the greater of the array in the parentheses after max; if a determination is completed, the count variable swn=swn+1 is updated and step 553 is performed.

At step 56, the non-disabled optimal result is updated, which includes the following steps:

at step 561, corresponding to each type of components $c_1 \in [1, \ldots, C]$, $ps\{c_1\}=pst\{c_1\}$ is updated; and the component type count c=1 is initialized;

at step 562, if c>C, it indicates that one traversal has been completed for all component types, the count variable IM=IM+1 is updated and step 52 is repeated; and otherwise, the swap operation count swn=1 is initialized and step 563 is performed;

at step 563, if swn>SWN{c}, it indicates that one traversal has been completed for all swap operations, the count variable c=c+1 is updated and step 562 is repeated, and otherwise, step 564 is performed;

at step 564, the component TC{c}(swn) in the tabu table is updated: it is determined whether swn=swt(c) is present; if yes, TC{c}(swn)=TL{c} is updated, and otherwise, TC{c}(swn)=max(TC{c}(swn)−1,0); after the determination is completed, the count variable swn=swn+1 is updated and step 563 is performed.

At step 6, performing neighborhood search operations on arrays of assignment sequences for various types of components, decoding the manipulated assignment sequence arrays to obtain new placement point distribution results and correspondingly, obtaining optimal placement sequencing results based on dynamic programming; if the new optimization results correspond to a better pick-and-place path, storing it as the optimal result.

The specific process of performing neighborhood search operation on the assignment sequence array of each type of component and decoding the operated assignment sequence array to obtain the new placement point distribution result, and then correspondingly obtaining the optimal placement sequence result based on dynamic planning; if the new optimization result corresponds to the better pick-and-place path, storing the optimization result as an optimal result comprises the following steps:

at step 61, if c>C, it indicates that one traversal has been completed for all component types, the count variable it=it+1 is updated, and step 53 is repeated, and otherwise, step 62 is performed;

at step 62, an ongoing operation $swi \in [1, \ldots, SWN\{c\}]$ is randomly selected, and the two components to be swapped are ni=SWL{c}(swi,1) and nj=SWL{c}(swi,2), and the swap is as follows: psn{c}(ni)=ps{c}(nj) and psn{c}(nj)=ps{c}(ni);

at step 63, the swapped assignment sequence array is decoded to obtain a new placement point distribution result, which includes the following steps:

at step 631, the component type count $c_1=1$ is initialized; the updated placement point distribution result PAn, the updated placement sequence result PSn, and the updated pick-and-place path length DZn are initialized, and PAn=PAb, PSn=PSb and DZn=DQ are assigned to store a newly-obtained pick-and-place path optimization result;

at step 632, if $c_1$>C, it indicates that one traversal has been completed for all component types, the PAP cycle count k=1 is initialized, and step 64 is performed; and otherwise, the placement point count ii=1 of the components of the $c_1$-th type is initialized and step 633 is performed;

at step 633, if ii>n{$c_1$}, it indicates that one traversal has been completed for all placement points of the components of the $c_1$-th type, and the count variable $c_1=c_{1+1}$ is updated, and step 632 is repeated; and otherwise, step 634 is performed;

at step 634, the candidate positions k=PL{$c_1$}(ii,1) and h=PL{$c_1$}(ii,2) are obtained, the placement point distribution result PAn(k,h)=psn{$c_1$}(ii) is updated, and the count variable ii=ii+1 is updated, and step 633 is repeated;

at step 64, dynamically-planned initialization is performed, which comprises the following steps:

at step 641, if k>K, it indicates that one traversal has been completed for all PAP cycles, and step 67 is performed and otherwise, the sucking rod count h=1 is initialized, the mount coordinate count variable S=0 is initialized, the mount sucking rod array hs is initialized as empty array, the mount coordinate array pt is initialized as empty array, and the step 642 is performed to calculate all mount coordinates in the present period;

at step 642, if h>H, it indicates that one traversal has been completed for all sucking rods, step 644 is performed and otherwise, step 643 is performed;

at step 643, the placement point p=PAn(k,h) mounted by the h-th sucking rod in the k-th PAP cycle is obtained; if p=0, no processing is performed; and otherwise, the mount sucking rod array hs=[hs h] is updated, namely, a new component h is added to the current mount sucking rod array hs, and the count variable S=S+1 is updated, and the mount coordinates pt(S,1)=xyt(p,1)−(h−1)*DI and pt(S,2)=xyt(p,2) are updated; the count variable h=h+1 is updated and step 642 is repeated;

at step 644, an array dt with a row number and a column number both being S with all components being zero is initialized to store a distance between the mount coordinates, and taken as a mount distance array; an array df with a row number 1 and a column number S with all components being zero is initialized to store a distance between each mount coordinate and the last pick coordinate in the k-th PAP cycle, and taken as a pick-to-mount distance array; an array dw with a row number 1 and a column number S with all components being zero is initialized to store a distance between each mount coordinate and the first pick coordinate in the (k+1)-th PAP cycle, and taken as a mount-to-pick distance array; a prior placement point count $s_1=1$ is initialized;

at step 645, if $s_1$>S, it indicates that one traversal has been completed for all prior placement points and step 640 is performed and otherwise, the posterior placement point count $s_2=s_1+1$ is initialized to and step 646 is performed;

at step 646, dx=|pt($s_1$,1)−xyql(k,1)| and dy=|pt($s_1$,2)−xyql(k,2)| are calculated, wherein symbol || represents an absolute value of a value therein; and the pick-to-mount distance df($s_1$)=max(dx,dy) is calculated;

at step 647, dx=|pt($s_1$,1)−xyqf(k+1,1)| and dy=|pt($s_1$,2)−xyqf(k+1,2)| are calculated, and the mount-to-pick distance dw($s_1$)=max(dx,dy) is calculated;

at step 648, if $s_2$>S, it indicates that one traversal has been completed for all posterior placement points, and the count variable $s_1=s_1+1$ is updated, and step 645 is repeated, and otherwise, step 649 is performed;

at step 649, dx=|pt($s_1$,1)−pt($s_2$,1)| and dy=|pt($s_1$,2)−pt($s_2$,2)| are calculated, the mount distance dt($s_1,s_2$)=dt($s_2,s_1$)=max(dx,dy) is calculated, the count variable $s_2=s_2+1$ is updated, and step 648 is repeated;

at step 6410, the dynamically-planned column number V=max(1,S−2) is initialized and assigned; full permutation of 1 to S is generated as M, and the array U=[1!, . . . , S!] is initialized and assigned, wherein the symbol ! refers to performing factorial (for example, S=3, M=[1 2 3; 1 3 2; 2 1 3; 2 3 1; 3 1 2; 3 2 1], and U=[1,2,6]) on a previous value; an array dd with a row number U(S) and a column number V with all components being zero is initialized to store a path length corresponding to each dynamically-planned node, and taken as a dynamically-planned distance array, and $dd(:,1)=df(M(:,1))+dw(M(:,S))$ is updated; the permutation count $u=0$ is initialized and the updated leftmost column count $V_1=1$ is initialized; an array J with a row number 1 and a column number V with all components being zero is initialized as the leftmost column tag array; step 65 is performed;

at step 65, based on dynamic planning, the optimal placement sequence in the k-th PAP cycle is obtained, which includes the following steps:

at step 651, if $u>U(S)$, it indicates that one traversal has been completed for all permutations and step 66 is performed, and otherwise, step 652 is performed;

at step 652, the count variable $u=u+1$ is updated and the column count $v=V_1$ is initialized and updated;

at step 653, if $v>V$, it indicates that one traversal has been completed for all columns, and step 657 is performed and otherwise, step 654 is performed;

at step 654, the indexes of two mount coordinates to be calculated for a spacing therebetween are $s_1=M(u,v)$ and $s_2=M(u,v+1)$; the to-be-updated maximum row number of the dynamically-planned distance array is $U_1=u+U(V+1-v)-1$; $u_1=u$ is initialized;

at step 655, if $u_1>U_1$, $s_1=M(u,S-1)$, $s_2=M(u,S)$, $dd(u,V)=dd(u,V)+dt(s_1,s_2)$ are updated, and the count variable $v=v+1$ is updated and step 653 is repeated, and otherwise, step 656 is performed;

at step 656, the minimum column number to be summed in the dynamically-planned distance array is $v_1=\max(1,v-1)$, and $dd(u_1,v)=\text{sum}(dd(u_1,v_1:v))+dt(s_1,s_2)$ is updated, wherein sum represents performing summing for the array in the parentheses; the count variable $u_1=u_1+1$ is updated and step 655 is repeated;

at step 657, $J(1)=J(1)+1$ is updated and the column count $v=1$ is initialized and updated;

at step 658, if $v>V$, $V_1=V+1-v_2$, and step 651 is repeated and otherwise, step 659 is performed;

at step 659, if $J(v)\leq U(v)$, $v_2=v$ and $v=V+1$, and step 658 is repeated, and otherwise, step 6510 is performed;

at step 6510, if $v<V$, $J(v+1)=J(v+1)+U(v)$ and $J(v)=0$ are updated, and otherwise, no processing is performed; the count variable $v=v+1$ is updated and step 658 is repeated;

at step 66, $[dm,um]=\min(dd(:,V))$ is obtained, wherein min represents a minimum value of the array in the parentheses after min, dm is a minimum pick-and-place path, um is a permutation index for achieving the minimum pick-and-place path, and the optimal placement sequence of the k-th PAP cycle is $PSn(k,1:S)=hs(M(um,:))$, and $DZn=DZn+dm$; the count variable $k=k+1$ is updated, and step 641 is repeated;

at step 67, it is determined whether $DZn<DZb$ is present; if yes, $DZb=DZn$, $swb(c)=swi$, $PAb=Pan$, $PSb=PSn$ are updated; corresponding to each type of components $c_i\in[1, \ldots, C]$, $psb\{c_i\}=psn\{c_i\}$ is updated, and otherwise, no processing is performed;

at step 68, it is determined whether $TC\{c\}(swi)=0$ is present and whether $DZn<DZt$; if yes, it indicates the current swap operation is not disabled, and the obtained result is superior to the non-disabled shortest path, and $DZt=DZn$ and $swt(c)=swi$ are updated; corresponding to each type of components $c_i\in[1, \ldots, C]$, $pst\{c_i\}=psn\{c_i\}$ is updated, and if not, no processing is performed;

at step 69, the count variable $c=c+1$ is updated and step 61 is repeated.

Embodiment 1

This embodiment provides a method of performing online optimization on a pick-and-place path during the production of a surface mount machine, which is performed as follows:

The pick-mount optimization process of the surface mount machine with a 6-sucking-rod gantry type surface mount carrier is described as an example.

The circuit board production data to be imported is listed in Table 1, where there are two types of components, each of which has 50 placement points.

TABLE 1

| | | | | Circuit board production data | | | | | | | |
|---|---|---|---|---|---|---|---|---|---|---|---|
| Component no. | Component type | X coordinate (mm) | Y coordinate (mm) | Component serial no. | Component type | X coordinate (mm) | Y coordinate (mm) | Component serial no. | Component type | X coordinate (mm) | Y coordinate (mm) |
| 1 | LED | 46.4 | 7.4 | 35 | LED | 23.6 | 41.5 | 69 | CAP | 145.2 | 32.8 |
| 2 | LED | 51.5 | 7.4 | 36 | LED | 4.8 | 14.6 | 70 | CAP | 147.3 | 27.2 |
| 3 | LED | 56.6 | 7.4 | 37 | LED | 9.9 | 14.6 | 71 | CAP | 104.0 | 8.6 |
| 4 | LED | 61.7 | 7.4 | 38 | LED | 14.4 | 14.6 | 72 | CAP | 107.1 | 17.1 |
| 5 | LED | 66.8 | 7.4 | 39 | LED | 19.0 | 14.6 | 73 | CAP | 104.0 | 22.8 |
| 6 | LED | 45.4 | 48.0 | 40 | LED | 23.6 | 14.6 | 74 | CAP | 107.1 | 30.3 |
| 7 | LED | 51.0 | 48.0 | 41 | LED | 9.2 | 4.8 | 75 | CAP | 104.0 | 37.0 |
| 8 | LED | 56.1 | 48.0 | 42 | LED | 15.3 | 4.8 | 76 | CAP | 99.1 | 11.4 |
| 9 | LED | 61.7 | 48.0 | 43 | LED | 21.9 | 4.8 | 77 | CAP | 95.5 | 16.5 |
| 10 | LED | 66.8 | 48.0 | 44 | LED | 28.5 | 4.8 | 78 | CAP | 99.1 | 21.6 |
| 11 | LED | 34.8 | 20.1 | 45 | LED | 35.6 | 4.8 | 79 | CAP | 95.5 | 26.7 |
| 12 | LED | 40.9 | 17.5 | 46 | LED | 8.7 | 49.0 | 80 | CAP | 99.1 | 32.3 |
| 13 | LED | 48.5 | 17.5 | 47 | LED | 15.8 | 49.0 | 81 | CAP | 175.2 | 41.5 |
| 14 | LED | 54.1 | 21.6 | 48 | LED | 22.4 | 49.0 | 82 | CAP | 170.6 | 41.5 |
| 15 | LED | 56.6 | 27.2 | 49 | LED | 29.0 | 49.0 | 83 | CAP | 166.1 | 41.5 |
| 16 | LED | 53.6 | 32.8 | 50 | LED | 35.6 | 49.0 | 84 | CAP | 161.0 | 41.5 |
| 17 | LED | 48.0 | 36.8 | 51 | CAP | 133.6 | 7.4 | 85 | CAP | 156.4 | 41.5 |
| 18 | LED | 40.3 | 37.3 | 52 | CAP | 128.5 | 7.4 | 86 | CAP | 175.2 | 14.6 |
| 19 | LED | 34.8 | 32.8 | 53 | CAP | 123.4 | 7.4 | 87 | CAP | 170.1 | 14.6 |
| 20 | LED | 32.7 | 27.2 | 54 | CAP | 118.3 | 7.4 | 88 | CAP | 165.6 | 14.6 |
| 21 | LED | 76.0 | 8.6 | 55 | CAP | 113.2 | 7.4 | 89 | CAP | 161.0 | 14.6 |

TABLE 1-continued

Circuit board production data

| Component no. | Component type | X coordinate (mm) | Y coordinate (mm) | Component serial no. | Component type | X coordinate (mm) | Y coordinate (mm) | Component serial no. | Component type | X coordinate (mm) | Y coordinate (mm) |
|---|---|---|---|---|---|---|---|---|---|---|---|
| 22 | LED | 72.9 | 17.1 | 56 | CAP | 134.6 | 48.0 | 90 | CAP | 156.4 | 14.6 |
| 23 | LED | 76.0 | 22.8 | 57 | CAP | 129.0 | 48.0 | 91 | CAP | 170.8 | 4.8 |
| 24 | LED | 72.9 | 30.3 | 58 | CAP | 123.9 | 48.0 | 92 | CAP | 164.7 | 4.8 |
| 25 | LED | 76.0 | 37.0 | 59 | CAP | 118.3 | 48.0 | 93 | CAP | 158.1 | 4.8 |
| 26 | LED | 80.9 | 11.4 | 60 | CAP | 113.2 | 48.0 | 94 | CAP | 151.5 | 4.8 |
| 27 | LED | 84.5 | 16.5 | 61 | CAP | 145.2 | 20.1 | 95 | CAP | 144.4 | 4.8 |
| 28 | LED | 80.9 | 21.6 | 62 | CAP | 139.1 | 17.5 | 96 | CAP | 171.3 | 49.0 |
| 29 | LED | 84.5 | 26.7 | 63 | CAP | 131.5 | 17.5 | 97 | CAP | 164.2 | 49.0 |
| 30 | LED | 80.9 | 32.3 | 64 | CAP | 125.9 | 21.6 | 98 | CAP | 157.6 | 49.0 |
| 31 | LED | 4.8 | 41.5 | 65 | CAP | 123.4 | 27.2 | 99 | CAP | 151.0 | 49.0 |
| 32 | LED | 9.4 | 41.5 | 66 | CAP | 126.4 | 32.8 | 100 | CAP | 144.4 | 49.0 |
| 33 | LED | 13.9 | 41.5 | 67 | CAP | 132.0 | 36.8 | | | | |
| 34 | LED | 19.0 | 41.5 | 68 | CAP | 139.7 | 37.3 | | | | |

In the initial pick-and-place path optimization result, the placement point distribution result PA0 and the placement sequence result PS0 are shown below.

$$PA0 = \begin{bmatrix} 36 & 79 & 22 & 77 & 27 & 90 \\ 31 & 80 & 10 & 75 & 29 & 85 \\ 46 & 78 & 9 & 60 & 30 & 98 \\ 41 & 71 & 5 & 76 & 26 & 93 \\ 32 & 73 & 25 & 74 & 28 & 84 \\ 37 & 55 & 21 & 72 & 23 & 89 \\ 33 & 54 & 24 & 59 & 4 & 83 \\ 38 & 65 & 3 & 53 & 15 & 88 \\ 42 & 58 & 14 & 64 & 8 & 92 \\ 47 & 52 & 16 & 66 & 2 & 97 \\ 39 & 57 & 13 & 63 & 7 & 87 \\ 34 & 51 & 17 & 67 & 1 & 82 \\ 43 & 56 & 12 & 62 & 6 & 91 \\ 48 & 100 & 18 & 68 & 50 & 96 \\ 40 & 61 & 45 & 95 & 11 & 86 \\ 35 & 70 & 19 & 69 & 20 & 81 \\ 44 & 99 & 49 & 94 & 0 & 0 \end{bmatrix} \quad PS0 = \begin{bmatrix} 5 & 1 & 4 & 6 & 3 & 2 \\ 5 & 3 & 1 & 6 & 4 & 2 \\ 5 & 3 & 6 & 1 & 4 & 2 \\ 5 & 6 & 1 & 3 & 4 & 2 \\ 5 & 1 & 6 & 3 & 4 & 2 \\ 5 & 1 & 6 & 3 & 4 & 2 \\ 5 & 3 & 1 & 6 & 4 & 2 \\ 5 & 3 & 1 & 6 & 4 & 2 \\ 5 & 3 & 6 & 1 & 4 & 2 \\ 5 & 3 & 6 & 1 & 4 & 2 \\ 5 & 3 & 1 & 6 & 4 & 2 \\ 5 & 3 & 1 & 6 & 4 & 2 \\ 5 & 3 & 6 & 1 & 4 & 2 \\ 5 & 3 & 6 & 1 & 4 & 2 \\ 5 & 3 & 1 & 6 & 4 & 2 \\ 5 & 3 & 1 & 6 & 4 & 2 \\ 3 & 1 & 4 & 2 & 0 & 0 \end{bmatrix}$$

Therefore, the following two placement point assignment sequence arrays of two types of components are obtained:

$ps0\{1\} = [36\ 22\ 27\ 31\ 10\ 29\ 46\ 9\ 30\ 41\ 5\ 26\ 32$ $25\ 28\ 37\ 21\ 23\ 33\ 24\ 4\ 38\ 3\ 15\ 42\ 14\ 8\ 47\ 16\ 2\ 39\ 13$ $7\ 34\ 17\ 1\ 43\ 12\ 6\ 48\ 18\ 50\ 40\ 45\ 11\ 35\ 19\ 20\ 44\ 49]$ $ps0\{2\} = [79\ 77\ 90\ 80\ 75\ 85\ 78\ 60\ 98\ 71\ 76\ 93\ 73\ 74\ 84$ $55\ 72\ 8954\ 59\ 8365\ 53\ 8858\ 64\ 92\ 52\ 66\ 97\ 57\ 63\ 87$ $51\ 67\ 82\ 56\ 62\ 91\ 100\ 68\ 96\ 61\ 95\ 86\ 70\ 69\ 81\ 99\ 94]$

Figure 5:
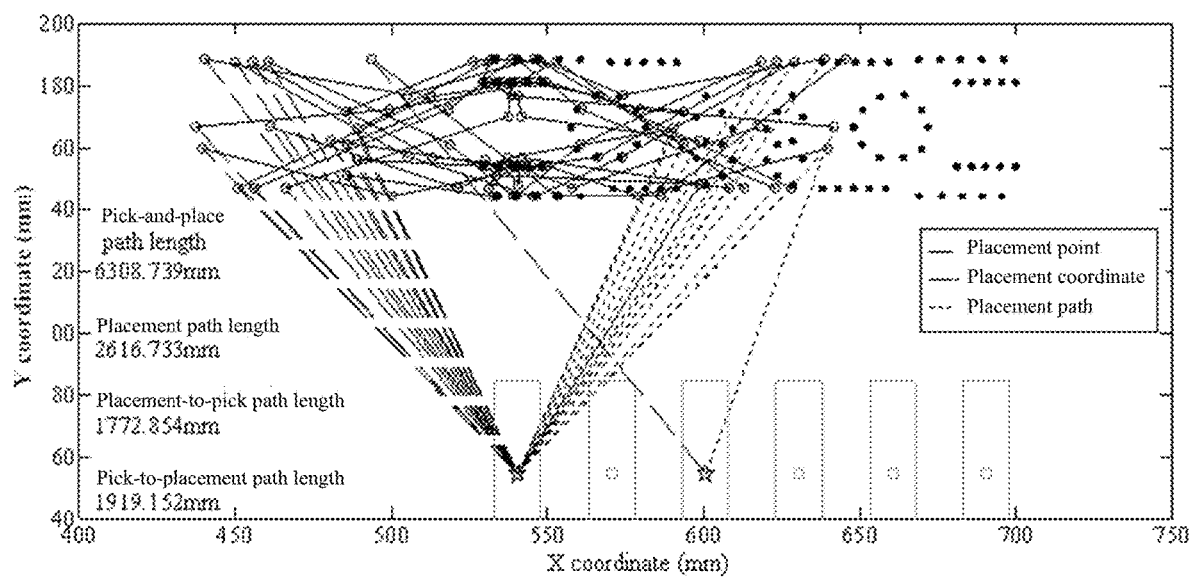
FIG. 5 is a schematic diagram illustrating an initial pick-and-place path according to an embodiment of the present disclosure.

The initial pick-and-place path as shown in FIG. 5 has a length of DZ0=6308.7 mm.

Based on the method of the present disclosure, the placement point distribution result PA and the placement sequence result PS are obtained from the optimal pick-and-place path result obtained by ten searches as shown below:

$$PA = \begin{bmatrix} 17 & 74 & 42 & 88 & 14 & 70 \\ 34 & 71 & 37 & 65 & 25 & 100 \\ 31 & 54 & 6 & 66 & 22 & 82 \\ 39 & 55 & 43 & 67 & 27 & 89 \\ 46 & 53 & 50 & 86 & 24 & 56 \\ 15 & 63 & 38 & 84 & 30 & 85 \\ 47 & 80 & 7 & 58 & 28 & 99 \\ 45 & 64 & 12 & 92 & 21 & 95 \\ 49 & 72 & 16 & 68 & 29 & 97 \\ 41 & 76 & 40 & 94 & 1 & 91 \\ 36 & 51 & 13 & 93 & 26 & 87 \\ 35 & 77 & 9 & 90 & 2 & 98 \\ 48 & 79 & 8 & 59 & 4 & 96 \\ 19 & 78 & 44 & 69 & 5 & 83 \\ 33 & 73 & 20 & 57 & 23 & 62 \\ 32 & 52 & 11 & 61 & 3 & 81 \\ 18 & 75 & 10 & 60 & 0 & 0 \end{bmatrix} \quad PS = \begin{bmatrix} 4 & 2 & 1 & 6 & 3 & 5 \\ 3 & 5 & 6 & 1 & 4 & 2 \\ 5 & 3 & 1 & 6 & 4 & 2 \\ 2 & 4 & 1 & 6 & 5 & 3 \\ 5 & 3 & 6 & 1 & 4 & 2 \\ 3 & 5 & 6 & 1 & 4 & 2 \\ 5 & 3 & 6 & 1 & 4 & 2 \\ 5 & 3 & 6 & 1 & 4 & 2 \\ 5 & 3 & 6 & 1 & 4 & 2 \\ 5 & 3 & 1 & 6 & 4 & 2 \\ 5 & 3 & 1 & 6 & 4 & 2 \\ 5 & 3 & 6 & 1 & 2 & 4 \\ 5 & 3 & 6 & 1 & 4 & 2 \\ 5 & 3 & 6 & 1 & 4 & 2 \\ 5 & 3 & 6 & 1 & 4 & 2 \\ 5 & 3 & 1 & 6 & 4 & 2 \\ 2 & 1 & 4 & 3 & 0 & 0 \end{bmatrix}$$

Correspondingly, the placement point assignment sequence arrays of two types of components are obtained as follows:

$ps\{1\} = [17\ 42\ 14\ 34\ 37\ 25\ 31\ 6\ 22\ 39\ 43\ 27$ $46\ 50\ 24\ 15\ 38\ 30\ 47\ 7\ 28\ 45\ 12\ 21\ 49\ 16\ 29\ 41\ 40\ 1$ $36\ 13\ 26\ 35\ 9\ 2\ 48\ 8\ 4\ 19\ 44\ 5\ 33\ 20\ 23\ 32\ 11\ 3\ 18\ 10]$ $ps\{2\} = [74\ 88\ 70\ 71\ 65\ 100\ 54\ 66\ 82\ 55\ 67\ 89\ 53\ 86\ 56$ $63\ 84\ 85\ 80\ 58\ 99\ 64\ 92\ 95\ 72\ 68\ 97\ 76\ 94\ 91\ 51\ 93$ $87\ 77\ 90\ 98\ 79\ 59\ 96\ 78\ 69\ 83\ 73\ 57\ 62\ 52\ 61\ 81\ 75\ 60]$

Figure 6:
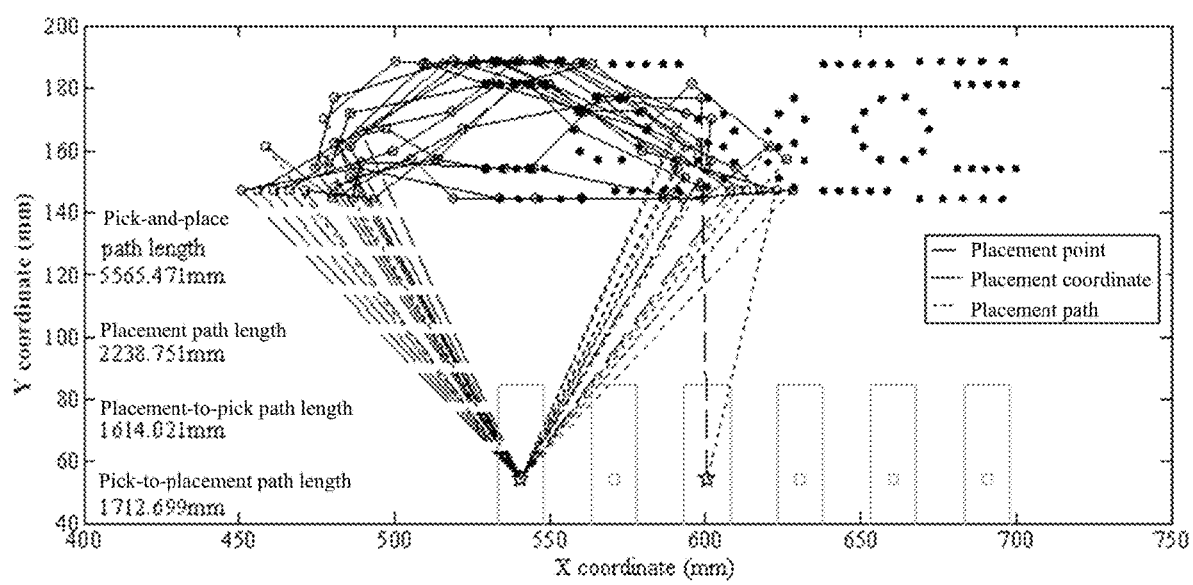
FIG. 6 is a schematic diagram illustrating an improved pick-and-place path according to an embodiment of the present disclosure.

The pick-and-place path as shown in FIG. 6 has a length of DZ=5565.5 mm.

Figure 7:
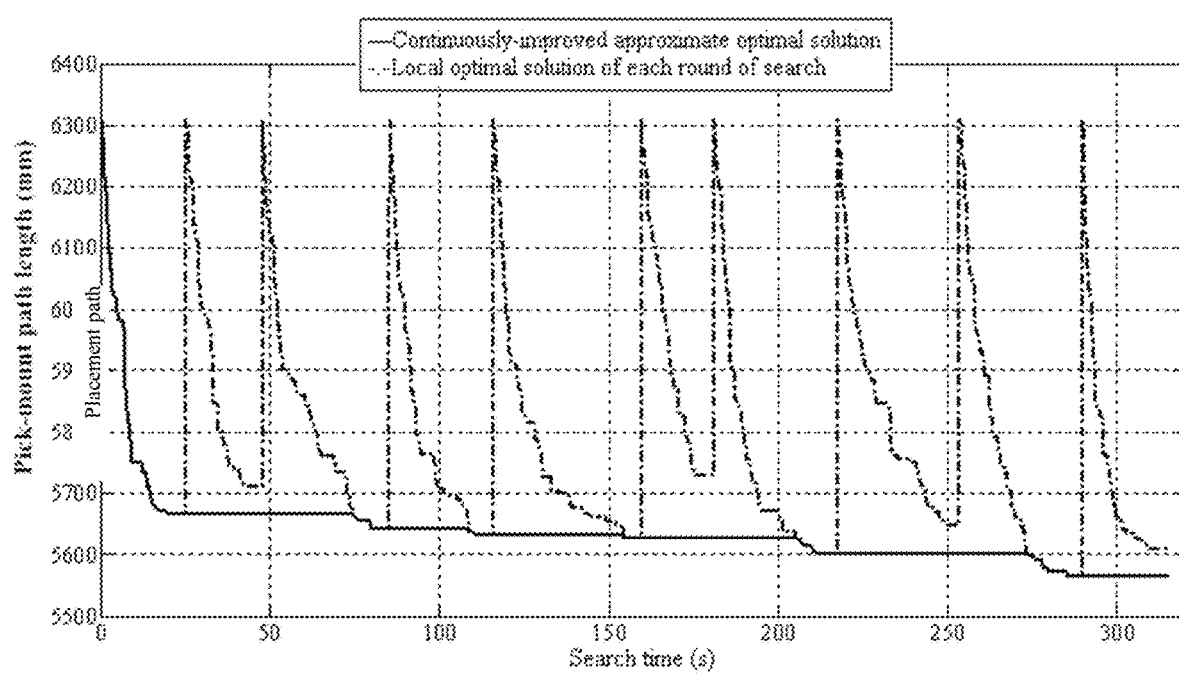
FIG. 7 is a converging curve of a pick-and-place path length according to an embodiment of the present disclosure.

During the search improvement process, the change of the pick-and-place path length is as shown in FIG. 7. In this embodiment, the pick-and-place path can be improved as 100%*(DZ−DZ0)/DZ0=11.78% by using the present disclosure.

The result of the online optimization of the pick-and-place path in the present disclosure is as shown in FIGS. 5 to 7, where FIG. 5 is a schematic diagram illustrating an initial pick-and-place path, FIG. 6 is a schematic diagram illustrating an improved pick-and-place path, and FIG. 7 is a converging curve of a pick-and-place path length according to an embodiment of the present disclosure.

In this method, after surface mount production is quickly carried out based on the initial optimization result, the placement point assignment sequence in each type of component is optimized based on tabu search algorithm, and then based on the obtained placement point distribution result, an optimal placement sequence result is obtained based on dynamical planning; if the result corresponds to a better pick-and-place path, based on the result, subsequent surface mount production is performed. Thus, the above optimization is continuously performed during the production of the surface mount machine, so as to maximize the mount production efficiency. Experiments show that the method provided by the present disclosure can greatly increase the production efficiency of the surface mount machine with the maximum efficiency increased by 11.78%. The optimization method provided by the present disclosure is generally applicable to various surface mount machines with different surface mount carriers.

Specifically, the present disclosure has the following two features:

(1) The present disclosure provides a pick-and-place path online optimization framework which realizes continuous improvement on the pick-and-place path to the optimal solution during the surface mount process without interrupting the production to distribute and adjust the resources and lowering the calculation real-timeness requirements, thereby increasing the subsequent production efficiency.

(2) The present disclosure has a stronger optimal solution search capability, such that the placement point assignment sequence in each type of component is optimized based on tabu search, and the optimal placement sequence result is directly obtained based on dynamic planning, so as to narrowing the search space while approaching the global optimal solution more stably.

The present disclosure may have other several embodiments. Without departing from the spirit and essence of the present disclosure, those skilled in the art can make various corresponding changes and variations to the present disclosure and such corresponding changes and variations shall all belong to the scope of protection of the claims appended to the present disclosure.

What is claimed is:

1. A method of performing online optimization on a pick-and-place path during production of a surface mount machine, comprising following steps:

at step 1, based on a mount optimization solver of the surface mount machine, obtaining an initial pick-and-place process optimization result, and transmitting the result into an industrial control computer of the surface mount machine to start a surface mount production;

at step 2, obtaining surface mount machine parameters, a circuit board production data and an initial pick-and-place path optimization result from the pick-and-place process optimization result;

at step 3, based on an imported initial pick-and-place (PAP) path optimization result, determining candidate positions for placement points of various types of components, along with an initial sequence array of placement points for the various types of components, comprising following steps:

at step 31, a PAP cycle count k=1 is initialized; corresponding to each type of components c∈[1, ..., C] with a total number of component types being C, an array PL{c}∈[PL{1}, ..., PL{C}] with a row number n{c} and a column number 2 with all components being zero is initialized to store the candidate positions of the placement points contained by each type of components, wherein PL{c} is referred to as a candidate position array of the components of a c-th type; corresponding to each type of components c∈[1, ..., C], an array ps0{c}∈[ps0{1}, ..., ps0{C}] with a row number n{c} and a column number 1 with all components being zero is initialized to store the placement point assignment sequence of each type of components, wherein ps0{c} is referred to as a assignment sequence array of the components of the c-th type; corresponding to each type of components c∈[1, ..., C], a count variable i{c}=1 is initialized as an index of the placement points of each type of components;

at step 32, if k>K, wherein K is direct to a total number of the PAP cycles, it indicates that one traversal has been completed for all PAP cycles, and step 4 is performed, and otherwise, a sucking rod count variable h=1 is initialized and step 33 is performed;

at step 33, if h>H, wherein H is directed to a total number of sucking rods, it indicates that one traversal has been completed for all sucking rods, cyclic variable k=k+1 is updated and the step 32 is repeated, and otherwise, step 34 is performed;

at step 34, a component type picked and mounted by a h-th sucking rod in a k-th PAP cycle is c=CG(k,h), and it is determined whether c=0; if yes, it indicates that the sucking rod in this cycle does not perform any mounting, a cyclic variable h=h+1 is updated, and step 33 is repeated, and otherwise, step 35 is performed;

at step 35, PL{c}(i{c},1)=k and PL{c}(i{c},2)=h are assigned and ps0{c}(i{c})=PA0(k,h) is also assigned; a count variable i{c}=i{c}+1 is updated, and a cyclic variable h=h+1 is updated, and step 33 is repeated; and at step 4, performing initialization on a tabu search, comprising following steps:

at step 41, an upper limit of the number of times of local search is initialized and assigned to IT=[(P)$^{0.5}$], wherein a symbol [ ] represents performing up-rounding for a value inside; a component type count c=1 is initialized;

at step 42, if c>C, it indicates that one traversal has been completed for all component types, and step 48 is performed and otherwise, step 43 is performed;

at step 43, the number of times that the components of a c-th type perform swap operation is SWN{c}=0.5*n{c}*(n{c}−1); an array SWL{c} with a row number SWN{c} and column number 2 with all components being zero is initialized to store swap operations the components of the c-th type perform; a swap operation count swn=0 is initialized; and a prior placement point count ni=1 is initialized;

at step 44, if ni>n{c}−1, it indicates that one traversal has been completed for all prior placement points, and step 47 is performed; and otherwise, a posterior placement point count nj=ni+1 is initialized and step 45 is performed;

at step 45, if nj>n{c}, it indicates that one traversal has been completed for all posterior placement points, and a count variable ni=ni+1 is updated, and step 44 is repeated, and otherwise, step 46 is performed;

at step 46, a count variables swn=swn+1, SWL{c}(swn,:)=[ni,nj] are updated, and a count variable nj=nj+1 is updated and step 45 is repeated;

at step 47, an array TC{c} with a row number SWN{c} and a column number 1 with all components being zero is initialized as a tabu table for the components of the c-th type, wherein each component in this array indicates whether a corresponding swap operation is disabled or not and a number of times of disabling, and an upper limit of the number of times of disabling is $TL\{c\}=\lceil(n\{c\})^{0.5}\rceil$; a count variable $c=c+1$ is updated and step 42 is repeated; and at step 48, an array swb with a row number C and a column number 1 with all components being zero are initialized to store an optimal swap operation of each type of component;

the array swt with the row number C and the column number 1 with all components being zero are initialized to store a non-disabled optimal swap operation of each type of components;

at step 5, employing the tabu search to compare and select optimal result for pick-and-place path optimization, transmitting a newly found optimal result to an industrial control computer of the surface mount machine, and based on this result, commencing subsequent surface mount production starting from a next circuit board, comprising following steps:

at step 51, a historical optimal pick-and-place path length DZ, a currently-solved pick-and-place path length DZb, a currently-solved placement point distribution result PAb, a currently-solved placement sequence result PSb are initialized, and DZ=DZ0, DZb=DZ0, PAb=PA0, PSb=PS0 are assigned; corresponding to each type of components $c \in [1, \ldots, C]$, $ps\{c\}=ps0\{c\}$ and $psb\{c\}=ps\{c\}$ are initialized and assigned to store an optimal assignment sequence, and $pst\{c\}=ps\{c\}$ is initialized and assigned to store a non-disabled optimal assignment sequence;

and a non-improved search count variable IM=0 is initialized and assigned;

at step 52, if IM>IT, it indicates that the number of times of the non-improved search reaches an upper limit, and step 51 is performed to start a next round of search, and otherwise, a non-disabled shortest path length DZt is initialized to infinity, a local search count variable it=1 is initialized and step 53 is performed;

at step 53, if it>IT, it indicates that the number of times of the local search reaches the upper limit and step 54 is performed; and otherwise, corresponding to each type of components $c_1 \in [1, \ldots, C]$, $psn\{c_1\}=ps\{c_1\}$ is initialized and assigned; and the component type count c=1 is initialized, and step 6 is performed;

at step 54, it is determined whether DZb<DZ; if yes, it indicates that a better pick-and-place path is obtained, and step 55 is performed and otherwise, step 56 is performed;

at step 55, the optimal result is updated and then transmitted into the industrial control computer of the surface mount machine and by starting from a next circuit board, subsequent surface mount production is performed based on the result; and at step 56, a non-disabled optimal result is updated; and at step 6, performing neighborhood search operations on arrays of assignment sequences for various types of components, decoding manipulated assignment sequence arrays to obtain new placement point distribution results and correspondingly, obtaining optimal placement sequencing results based on dynamic programming; if new optimization results correspond to the better pick-and-place path; and storing the new optimization results as the optimal result.

2. The method of claim 1, wherein the process of obtaining the surface mount machine parameters, the circuit board production data and the initial pick-and-place path optimization result comprising following steps:

at step 21, the surface mount machine parameters are imported, wherein the surface mount machine parameters comprise a total number H of sucking rods, an index of each sucking rod is numbered as $h \in [1, \ldots, H]$ in a sequence of increasing along X axis, and a spacing between the sucking rods is DI;

at step 22, the circuit board production data is imported; wherein the circuit board production data comprises: a total number C of component types, the index serial number of each type of components $c \in [1, \ldots, C]$, a number of the contained placement points $n\{c\} \in [n\{1\}, \ldots, n\{C\}]$, a total number P of placement points, and an index serial number of each placement point $p \in [1, \ldots, P]$, coordinates of the placement points are stored in a two-dimensional array xyt with a row number P and a column number 2, wherein a X coordinate and Y coordinate of a P-th placement point are xyt(p,1) and xyt(p,2) respectively; and the coordinate of the placement points becomes a mount coordinate corresponding to the placement points only after being transformed into a fixed reference point coordinate on the surface mount carrier; and at step 23, the initial pick-and-place path optimization result is imported; the total number of the PAP cycles is K and the index serial number of each PAP cycle is $k \in [1, \ldots, K]$; the component distribution result is stored in a two-dimensional array CG with a row number K and a column number H, wherein a component CG (k,h) represents an component type picked and mounted by a h-th sucking rod in the K-th PAP cycle, namely, $CG(k,h) \in [1, \ldots, C]$; the placement point distribution result is stored in a two-dimensional array PA0 with a row number K and a column number H, wherein a component PA0(k,h) represents a placement point number mounted by the h-th sucking rod in the k-th PAP cycle, namely, $PA0(k,h) \in [1, \ldots, P]$; the placement sequence result is stored in a two-dimensional array PS0 with a row number K and a column number H, wherein a component PS0(k,s) represents an s-th sucking rod number performing mounting in the k-th PAP cycle, namely, $PS0(k,s) \in [1, \ldots, H]$; a pick-and-place path length is DZ0, and a pick path length is DQ; pick coordinates corresponding to first and last pick points in each PAP cycle are stored in two-dimensional arrays xyqf and xyql with a row number K and a column number 2, wherein components xyqf(k,1) and xyqf(k,2) represent the X coordinate and the Y coordinate of the pick coordinate corresponding to the first pick point in the k-th PAP cycle, and the components xyql(k,1) and xyql(k,2) represent the X coordinate and the Y coordinate of the pick coordinate corresponding to the last pick point in the k-th PAP cycle.

3. The method of claim 1, wherein the process that the optimal result is updated and then transmitted into the industrial control computer of the surface mount machine and by starting from a next circuit board, the subsequent surface mount production is performed based on the result in the step 55 comprises the following steps:

at step 551, IM=0 is updated, the optimal results DZ=DZb, PA=PAb, PS=PSb are updated;

corresponding to each type of components $c_1 \in [1, \ldots, C]$, $ps\{c_1\}=psb\{c_1\}$ is updated and the optimal result is transmitted into the industrial control computer of the surface mount machine and by starting from a next circuit board, the subsequent surface mount production is performed based on the result; the component type count c=1 is initialized;

at step 552, if c>C, it indicates that one traversal has been completed for all component types, the count variable IM=IM+1 is updated, and step 52 is repeated, and otherwise, the swap operation count swn=1 is initialized and step 553 is performed;

at step 553, if swn>SWN {c}, it indicates that one traversal has been completed for all swap operations, and the count variable c=c+1 is updated, and step 552 is repeated and otherwise, step 554 is performed; and at step 554, the component TC {c} (swn) in the tabu table is updated: it is determined whether swn=swb(c) is present; if yes, TC{c}(swn)=TL{c} is updated, and otherwise, TC{c}(swn)=max(TC {c}(swn)−1,0), wherein max represents selecting the greater of the array in the parentheses after max; if determination is completed, the count variable swn=swn+1 is updated and step 553 is performed.

4. The method of claim 3, wherein the process that the non-disabled optimal result is updated in step 56 comprises the following steps:

at step 561, corresponding to each type of components $c_1 \in [1, \ldots, C]$, $ps\{c_1\}=pst\{c_1\}$ is updated; and the component type count c=1 is initialized;

at step 562, if c>C, it indicates that one traversal has been completed for all component types, the count variable IM=IM+1 is updated and step 52 is repeated; and otherwise, the swap operation count swn=1 is initialized and step 563 is performed;

at step 563, if swn>SWN{c}, it indicates that one traversal has been completed for all swap operations, the count variable c=c+1 is updated and step 562 is repeated, and otherwise, step 564 is performed; and at step 564, the component TC{c}(swn) in the tabu table is updated: it is determined whether swn=swt(c) is present; if yes, TC{c}(swn)=TL{c} is updated, and otherwise, TC{c}(swn)=max(TC{c}(swn)−1,0); after the determination is completed, the count variable swn=swn+1 is updated and step 563 is performed.

5. The method of claim 1, wherein the specific process of performing neighborhood search operation on the assignment sequence array of each type of components and decoding the operated assignment sequence array to obtain the new placement point distribution result, and then correspondingly obtaining the optimal placement sequence result based on dynamic programming; if the new optimization result corresponds to the better pick-and-place path, storing the optimization result as the optimal result comprises the following steps:

at step 61, if c>C, it indicates that one traversal has been completed for all component types, the count variable it=it+1 is updated, and step 53 is repeated, and otherwise, step 62 is performed;

at step 62, an ongoing operation swi∈[1, . . . , SWN{c}] is randomly selected, and the two components to be swapped are ni=SWL{c}(swi,1) and nj=SWL{c}(swi, 2), and the swap is as follows: psn{c}(ni)=ps{c}(nj) and psn{c}(nj)=ps{c}(ni);

at step 63, the swapped assignment sequence array is decoded to obtain a new placement point distribution result;

at step 64, dynamically-programmed initialization is performed, which comprises the following steps:

at step 641, if k>K, step 67 is performed and otherwise, the sucking rod count h=1 is initialized, the mount coordinate count variable S=0 is initialized, the mount sucking rod array hs is initialized as empty array, the mount coordinate array pt is initialized as empty array, and the step 642 is performed to calculate all mount coordinates in the present cycle;

at step 642, if h>H, step 644 is performed and otherwise, step 643 is performed;

at step 643, the placement point p=PAn(k,h) mounted by the h-th sucking rod in the k-th PAP cycle is obtained; if p=0, no processing is performed; and otherwise, the mount sucking rod array hs=[hs h] is updated and the count variable S=S+1 is updated, and the mount coordinates pt(S,1)=xyt(p,1)−(h−1)*DI and pt(S,2)=xyt(p, 2) are updated; the count variable h=h+1 is updated and step 642 is repeated;

at step 644, an array dt with a row number and a column number both being S with all components being zero is initialized to store a distance between the mount coordinates, and taken as a mount distance array; an array df with a row number 1 and a column number S with all components being zero is initialized to store a distance between each mount coordinate and the last pick coordinate in the k-th PAP cycle, and taken as a pick-to-mount distance array; an array dw with a row number 1 and a column number S with all components being zero is initialized to store a distance between each mount coordinate and the first pick coordinate in the (k+1)-th PAP cycle, and taken as a mount-to-pick distance array; a prior placement point count $s_1=1$ is initialized;

at step 645, if $s_1$>S, it indicates that one traversal has been completed for all prior placement points and step 640 is performed and otherwise, the posterior placement point count $s_2=S_1+1$ is initialized to and step 646 is performed;

at step 646, $dx=|pt(s_1,1)-xyql(k,1)|$ and $dy=|pt(s_1,2)-xyql(k,2)|$ are calculated, wherein symbol ∥ represents an absolute value of a value therein; and the pick-to-mount distance $df(s_1)=\max(dx,dy)$ is calculated;

at step 647, $dx=|pt(s_1,1)-xyqf(k+1,1)|$ and $dy=|pt(s_1,2)-xyqf(k+1,2)|$ are calculated, and the mount-to-pick distance dw ($S1$)=max (dx,dy) is calculated;

at step 648, if $s_2$>S, it indicates that one traversal has been complete for all posterior placement points, and the count variable $s_1=s_1+1$ is updated, and step 645 is repeated, and otherwise, step 649 is performed;

at step 649, $dx=|pt(s_1,1)-pt(s_2,1)|$ and $dy=|pt(s_1,2)-pt(s_2,2)|$ are calculated, the mount distance $dt(s_1,s_2)=dt(s_2,s_1)=\max(dx,dy)$ is calculated, the count variable $s_2=s_2+1$ is updated, and step 648 is repeated; and at step 6410, the dynamically-programmed column number V=max (1,S−2) is initialized and assigned; full permutation of 1 to S is generated as M, and the array U=[1!, . . . , S!] is initialized and assigned, wherein the symbol! refers to performing factorial on a previous value; an array dd with a row number U(S) and a column number V with all components being zero is initialized to store a path length corresponding to each dynamically-programmed node, and taken as a dynamically-programmed distance array, and dd(:,1)=df(M(:, 1))+dw(M(:,S)) is updated; the permutation count u=0 is initialized and the updated leftmost column count $V_1=1$ is initialized; an array J with a row number 1 and a column number V with all components being zero is initialized as the leftmost column tag array; step 65 is performed; and at step 65, based on dynamic programming, the optimal placement sequence in the k-th PAP cycle is obtained.

6. The method of claim 5, wherein the process of decoding the swapped assignment sequence array to obtain the new placement point distribution result in step 63 comprises the following steps:

at step 631, the component type count $c_1=1$ is initialized; the updated placement point distribution result PAn, the updated placement sequence result PSn, and the updated pick-and-place path length DZn are initialized, and PAn=PAb, PSn=PSb and DZn=DQ are assigned to store a newly-obtained pick-and-place path optimization result;

at step 632, if $c_1>C$, it indicates that one traversal has been completed for all component types, the PAP cycle count k=1 is initialized, and step 64 is performed; and otherwise, the placement point count ii=1 of the components of the $c_1$-th type is initialized and step 633 is performed;

at step 633, if ii>n$\{c_1\}$, it indicates that one traversal has been completed for all placement points of the components of the $c_1$-th type, and the count variable $c_1=c_1+1$ is updated, and step 632 is repeated; and otherwise, step 634 is performed; and at step 634, the candidate positions k=PL$\{c_1\}$(ii,1) and h=PL$\{c_1\}$(ii,2) are obtained, the placement point distribution result PAn(k,h)=psn$\{c_1\}$(ii) is updated, and the count variable ii=ii+1 is updated, and step 633 is repeated.

7. The method of claim 6, wherein the process of, based on dynamic programming, obtaining the optimal placement sequence in the k-th PAP cycle in step 65 comprises the following steps:

at step 651, if u>U(S), it indicates that one traversal has been completed for all permutations and step 66 is performed, and otherwise, step 652 is performed;

at step 652, the count variable u=u+1 is updated and the column count v=$V_1$ is initialized and updated;

at step 653, if v>V, it indicates that one traversal has been completed for all columns, and step 657 is performed and otherwise, step 654 is performed;

at step 654, the indexes of two mount coordinates to be calculated for a spacing therebetween are $s_1$=M(u,v) and $s_2$=M(u,v+1); the to-be-updated maximum row number of the dynamically-programmed distance array is $U_1$=u+U(V+1−v)−1; $u_1$=u is initialized;

at step 655, if $u_1>U_1$, $S_1$=M(u,S−1), $s_2$=M(u,S), dd(u,V)=dd(u,V)+dt($s_1,s_2$) are updated, and the count variable v=v+1 is updated and step 653 is repeated, and otherwise, step 656 is performed;

at step 656, the minimum column number to be summed in the dynamically-programmed distance array is $v_1$=max(1,v−1), and dd($u_1$,v)=sum(dd($u_1,v_1$:v))+dt($s_1,s_2$) is updated, wherein sum represents performing summing for the array in the parentheses; the count variable $u_1=u_1+1$ is updated and step 655 is repeated;

at step 657, J(1)=J(+1)+1 is updated and the column count v=1 is initialized and updated;

at step 658, if v>V, $V_1$=V+1−$v_2$, and step 651 is repeated and otherwise, step 659 is performed;

at step 659, if J(v)≤U(v), $v_2$=v and v=V+1, and step 658 is repeated, and otherwise, step 6510 is performed; and at step 6510, if v<V, J(v+1)=J(v+1)+U(v) and J(v)=0 are updated, and otherwise, no processing is performed; the count variable v=v+1 is updated and step 658 is repeated;

at step 66, [dm,um]=min(dd(:,V)) is obtained, wherein min represents a minimum value of the array in the parentheses after min, dm is a minimum pick-and-place path, um is a permutation index for achieving the minimum pick-and-place path, and the optimal placement sequence of the k-th PAP cycle is PSn(k,1:S)=hs (M(um,:)), and DZn=DZn+dm; the count variable k=k+1 is updated, and step 641 is repeated;

at step 67, it is determined whether DZn<DZb is present; if yes, DZb=DZn, swb (c)=swi, PAb=Pan, PSb=PSn are updated; corresponding to each type of components $c_1 \in [1, \ldots, C]$, psb$\{c_1\}$=psn$\{c_1\}$ is updated, and otherwise, no processing is performed;

at step 68, it is determined whether TC$\{c\}$(swi)=0 is present and whether DZn<DZt; if yes, it indicates the current swap operation is not disabled, and the obtained result is superior to the non-disabled shortest path, and DZt=DZn and swt (c)=swi are updated; corresponding to each type of components $c_1 \in [1, \ldots, C]$, pst$\{c_1\}$=psn$\{c_1\}$ is updated, and if not, no processing is performed; and at step 69, the count variable c=c+1 is updated and step 61 is repeated.

8. The method of claim 3, wherein the specific process of performing neighborhood search operation on the assignment sequence array of each type of components and decoding the operated assignment sequence array to obtain the new placement point distribution result, and then correspondingly obtaining the optimal placement sequence result based on dynamic programming; if the new optimization result corresponds to the better pick-and-place path, storing the optimization result as an optimal result comprises the following steps:

at step 61, if c>C, it indicates that one traversal has been completed for all component types, the count variable it=it+1 is updated, and step 53 is repeated, and otherwise, step 62 is performed;

at step 62, an ongoing operation swie [1, ..., SWN$\{c\}$] is randomly selected, and the two components to be swapped are ni=SWL$\{c\}$(swi,1) and nj=SWL$\{c\}$(swi, 2), and the swap is as follows: psn$\{c\}$(ni)=ps$\{c\}$(nj) and psn$\{c\}$(nj)=ps$\{c\}$(ni);

at step 63, the swapped assignment sequence array is decoded to obtain a new placement point distribution result;

at step 64, dynamically-programmed initialization is performed, which comprises the following steps:

at step 641, if k>K, step 67 is performed and otherwise, the sucking rod count h=1 is initialized, the mount coordinate count variable S=0 is initialized, the mount sucking rod array hs is initialized as empty array, the mount coordinate array pt is initialized as empty array, and the step 642 is performed to calculate all mount coordinates in the present cycle;

at step 642, if h>H, step 644 is performed and otherwise, step 643 is performed;

at step 643, the placement point p=PAn (k,h) mounted by the h-th sucking rod in the k-th PAP cycle is obtained; if p=0, no processing is performed; and otherwise, the mount sucking rod array hs=[hs h] is updated and the count variable S=S+1 is updated, and the mount coordinates pt(S,1)=xyt(p,1)−(h−1)*DI and pt(S,2)=xyt(p, 2) are updated; the count variable h=h+1 is updated and step 642 is repeated;

at step 644, an array dt with a row number and a column number both being S with all components being zero is initialized to store a distance between the mount coordinates, and taken as a mount distance array; an array df with a row number 1 and a column number S with all components being zero is initialized to store a distance between each mount coordinate and the last pick coordinate in the k-th PAP cycle, and taken as a pick-to-mount distance array; an array dw with a row number 1 and a column number S with all components being zero is initialized to store a distance between each mount coordinate and the first pick coordinate in the (k+1)-th PAP cycle, and taken as a mount-to-pick distance array; a prior placement point count $s_1=1$ is initialized;

at step 645, if $s_1>S$, it indicates that one traversal has been completed for all prior placement points and step 640 is performed and otherwise, the posterior placement point count $s_2=s_1+1$ is initialized to and step 646 is performed;

at step 646, dx=|pt($s_1$,1)−xyql(k,1)| and dy=|pt($s_1$,2)−xyql(k,2)| are calculated, wherein symbol ∥ represents an absolute value of a value therein; and the pick-to-mount distance df($s_1$)=max(dx,dy) is calculated;

at step 647, dx=|pt($s_1$,1)−xyqf(k+1|1)| and dy=|pt($s_1$,2)−xyqf(k+1|2)| are calculated, and the mount-to-pick distance dw($s_1$)=max(dx,dy) is calculated;

at step 648, if $s_2>S$, it indicates that one traversal has been complete for all posterior placement points, and the count variable $s_1=s_1+1$ is updated, and step 645 is repeated, and otherwise, step 649 is performed;

at step 649, dx=|pt($s_1$,1)−pt($s_2$,1)| and dy=|pt($s_1$,2)−pt($s_2$2)| are calculated, the mount distance dt($s_1$,$s_2$)=dt($s_2$,$s_1$)=max(dx,dy) is calculated, the count variable $s_2=s_2+1$ is updated, and step 648 is repeated; and at step 6410, the dynamically-programmed column number V=max (1,S−2) is initialized and assigned; full permutation of 1 to S is generated as M, and the array U=[1!, . . . , S!] is initialized and assigned, wherein the symbol! refers to performing factorial on a previous value; an array dd with a row number U(S) and a column number V with all components being zero is initialized to store a path length corresponding to each dynamically-programmed node, and taken as a dynamically-programmed distance array, and dd(:,1)=df(M(:,1))+dw(M(:,S)) is updated; the permutation count u=0 is initialized and the updated leftmost column count $V_1=1$ is initialized; an array J with a row number 1 and a column number V with all components being zero is initialized as the leftmost column tag array; step 65 is performed; and at step 65, based on dynamic programming, the optimal placement sequence in the k-th PAP cycle is obtained.

9. The method of any one of claim 4, wherein the specific process of performing neighborhood search operation on the assignment sequence array of each type of components and decoding the operated assignment sequence array to obtain the new placement point distribution result, and then correspondingly obtaining the optimal placement sequence result based on dynamic programming; if the new optimization result corresponds to the better pick-and-place path, storing the optimization result as an optimal result comprises the following steps:

at step 61, if c>C, it indicates that one traversal has been completed for all component types, the count variable it=it+1 is updated, and step 53 is repeated, and otherwise, step 62 is performed;

at step 62, an ongoing operation swi∈[1, . . . , SWN{c}] is randomly selected, and the two components to be swapped are ni=SWL{c}(swi,1) and nj=SWL{c}(swi,2), and the swap is as follows: psn{c}(ni)=ps{c}(nj) and psn{c}(nj)=ps{c}(ni);

at step 63, the swapped assignment sequence array is decoded to obtain a new placement point distribution result;

at step 64, dynamically-programmed initialization is performed, which comprises the following steps:

at step 641, if k>K, step 67 is performed and otherwise, the sucking rod count h=1 is initialized, the mount coordinate count variable S=0 is initialized, the mount sucking rod array hs is initialized as empty array, the mount coordinate array pt is initialized as empty array, and the step 642 is performed to calculate all mount coordinates in the present cycle;

at step 642, if h>H, step 644 is performed and otherwise, step 643 is performed;

at step 643, the placement point p=PAn(k,h) mounted by the h-th sucking rod in the k-th PAP cycle is obtained; if p=0, no processing is performed; and otherwise, the mount sucking rod array hs=[hs h] is updated and the count variable S=S+1 is updated, and the mount coordinates pt(S,1)=xyt(p,1)−(h−1)*DI and pt(S,2)=xyt(p,2) are updated; the count variable h=h+1 is updated and step 642 is repeated;

at step 644, an array dt with a row number and a column number both being S with all components being zero is initialized to store a distance between the mount coordinates, and taken as a mount distance array; an array df with a row number 1 and a column number S with all components being zero is initialized to store a distance between each mount coordinate and the last pick coordinate in the k-th PAP cycle, and taken as a pick-to-mount distance array; an array dw with a row number 1 and a column number S with all components being zero is initialized to store a distance between each mount coordinate and the first pick coordinate in the (k+1)-th PAP cycle, and taken as a mount-to-pick distance array; a prior placement point count $s_1=1$ is initialized;

at step 645, if $s_1>S$, it indicates that one traversal has been completed for all prior placement points and step 640 is performed and otherwise, the posterior placement point count $s_2=s_1+1$ is initialized to and step 646 is performed;

at step 646, dx=|pt($s_1$,1)−xyql(k,1)| and dy=|pt($s_1$,2)−xyql(k,2)| are calculated, wherein symbol ∥ represents an absolute value of a value therein; and the pick-to-mount distance df($s_1$)=max(dx,dy) is calculated;

at step 647, dx=|pt($s_1$,1)−xyqf(k+1, 1)| and dy=|pt($s_1$,2)−xyqf(k+1, 2)| are calculated, and the mount-to-pick distance dw($s_1$)=max(dx,dy) is calculated;

at step 648, if $s_2>S$, it indicates that one traversal has been complete for all posterior placement points, and the count variable $s_1=s_1+1$ is updated, and step 645 is repeated, and otherwise, step 649 is performed;

at step 649, dx=|pt($s_1$,1)−pt($s_2$,1)| and dy=|pt($s_1$,2)−pt($s_2$, 2)| are calculated, the mount distance dt($s_1$,$s_2$)=dt($s_2$, $s_1$)=max(dx,dy) is calculated, the count variable $s_2=s_2+1$ is updated, and step 648 is repeated; and at step 6410, the dynamically-programmed column number V=max (1,S−2) is initialized and assigned; full permutation of 1 to S is generated as M, and the array U=[1!, . . . , S!] is initialized and assigned, wherein the symbol! refers to performing factorial on a previous value; an array dd with a row number U(S) and a column number V with all components being zero is initialized to store a path length corresponding to each dynamically-programmed node, and taken as a dynamically-programmed distance array, and dd(:,1)=df(M(:,1))+dw(M(:,S)) is updated; the permutation count u=0 is initialized and the updated leftmost column count $V_1$=1 is initialized; an array J with a row number 1 and a column number V with all components being zero is initialized as the leftmost column tag array; step 65 is performed; and at step 65, based on dynamic programming, the optimal placement sequence in the k-th PAP cycle is obtained.

\* \* \* \* \*